(12) United States Patent
Laroia et al.

(10) Patent No.: US 9,083,355 B2
(45) Date of Patent: *Jul. 14, 2015

(54) METHOD AND APPARATUS FOR END NODE ASSISTED NEIGHBOR DISCOVERY

(75) Inventors: Rajiv Laroia, Basking Ridge, NJ (US);
Pablo Anigstein, Springfield, NJ (US);

(Continued)

(73) Assignee: QUALCOMM Incorporated, San Diego, CA (US)

(*) Notice: Subject to any disclaimer, the term of this patent is extended or adjusted under 35 U.S.C. 154(b) by 592 days.

This patent is subject to a terminal disclaimer.

(21) Appl. No.: 13/332,210

(22) Filed: Dec. 20, 2011

(65) Prior Publication Data

US 2012/0087312 A1 Apr. 12, 2012

Related U.S. Application Data

(63) Continuation of application No. 11/316,603, filed on Feb. 24, 2006, now abandoned.

(51) Int. Cl.
*H04W 40/00* (2009.01)
*H03L 7/085* (2006.01)
(Continued)

(52) U.S. Cl.
CPC ............... *H03L 7/085* (2013.01); *H04W 8/26* (2013.01); *H04W 88/08* (2013.01); *H04L 7/0004* (2013.01); *H04L 7/033* (2013.01)

(58) Field of Classification Search
CPC ............ H04W 36/30; H04W 36/0072; H04W 36/0022; H04W 36/0083; H04W 36/0066; H04W 36/14; H04W 36/0005; H04W 36/0016; H04W 36/0055; H04W 36/04; H04W 36/18; H04W 36/24; H04W 36/0094; H04W 36/12; H04W 84/18; H04W 40/246; H04W 40/02; H04W 40/24; H04W 40/248; H04W 80/04; H04W 40/32; H04W 8/26; H04L 45/54; H04L 45/04; H04L 45/28; H04L 45/74; H04L 41/12; H04L 45/00; H04L 45/16; H04L 45/745; H04L 45/26; H04L 45/08; H04L 61/103; H04L 12/4641; H04L 41/0213; H04L 41/0654; H04L 45/021; H04L 45/20; H04L 45/34; H04L 45/48; H04L 47/125; H04L 67/10; H04L 12/1836; H04L 12/185
USPC ......... 370/331, 332, 312, 252, 235, 236, 242, 370/311, 328, 392; 455/552.1, 438, 561, 455/426.1, 11.1, 411, 435.2, 440, 442, 444, 455/452.1, 466, 522, 560, 67.11, 445, 450; 709/218, 242
See application file for complete search history.

(56) References Cited

U.S. PATENT DOCUMENTS 4,833,701 A 5/1989 Comroe et al.
(Continued)

FOREIGN PATENT DOCUMENTS

AU 2002353616 5/2003
(Continued)

OTHER PUBLICATIONS

Zhou, S., et al., "A Location Management Scheme for Mobility Support in Wireless IP Networks Using Session Initiation Protocol (SIP)", 1531-2216/01 IEEE, pp. 486-491, Oct. 2001.
(Continued)

*Primary Examiner* — Fred Casca
(74) *Attorney, Agent, or Firm* — Anthony R. Morris

(57) ABSTRACT

Methods and apparatus for using end nodes, e.g., wireless terminals, to discover base stations and communicate information about discovered access nodes, e.g., base stations, to other access nodes in a system are described. As the wireless terminal roams in the system and new access nodes are encountered, one or more physically adjacent access nodes will be informed of the presence of the new access node as a result of communications with the wireless terminal. A message indicating an access node's inability to route a message to another access node which is known to a wireless terminal may trigger the wireless terminal to begin the process of updating access node routing and neighbor information.

4 Claims, 8 Drawing Sheets

(72) Inventors: David R. Mazik, Howell, NJ (US);
Vladimir Parizhsky, New York, NY
(US); Vincent Park, Budd Lake, NJ
(US); Murari Srinivasan, Palo Alto, CA
(US); George Tsirtsis, New York, NY
(US)

(51) Int. Cl.
*H04W 8/26* (2009.01)
*H04W 88/08* (2009.01)
*H04L 7/00* (2006.01)
*H04L 7/033* (2006.01)

(56) References Cited

U.S. PATENT DOCUMENTS

| | | |
|---|---|---|
| 5,117,502 A | 5/1992 | Onoda et al. |
| 5,128,938 A | 7/1992 | Borras |
| 5,200,952 A | 4/1993 | Bernstein et al. |
| 5,208,837 A | 5/1993 | Richey |
| 5,229,992 A | 7/1993 | Jurkevich et al. |
| 5,247,516 A | 9/1993 | Bernstein et al. |
| 5,251,209 A | 10/1993 | Jurkevich et al. |
| 5,267,261 A | 11/1993 | Blakeney, II et al. |
| 5,268,933 A | 12/1993 | Averbuch |
| 5,388,102 A | 2/1995 | Griffith et al. |
| 5,490,139 A | 2/1996 | Baker et al. |
| 5,491,835 A | 2/1996 | Sasuta et al. |
| 5,509,027 A | 4/1996 | Vook et al. |
| 5,539,925 A | 7/1996 | Yli-Kotila et al. |
| 5,561,841 A | 10/1996 | Markus |
| 5,572,528 A | 11/1996 | Shuen |
| 5,574,720 A | 11/1996 | Lee |
| 5,594,943 A | 1/1997 | Balachandran |
| 5,694,548 A | 12/1997 | Baugher et al. |
| 5,722,044 A | 2/1998 | Padovani et al. |
| 5,737,328 A | 4/1998 | Norman et al. |
| 5,794,137 A | 8/1998 | Harte |
| 5,854,785 A | 12/1998 | Willey |
| 5,870,427 A | 2/1999 | Tiedemann, Jr. et al. |
| 5,974,036 A | 10/1999 | Acharya et al. |
| 5,978,366 A | 11/1999 | Massingill et al. |
| 6,016,316 A | 1/2000 | Moura et al. |
| 6,018,521 A | 1/2000 | Timbs et al. |
| 6,031,863 A | 2/2000 | Jusa et al. |
| 6,034,950 A | 3/2000 | Sauer et al. |
| 6,049,543 A | 4/2000 | Sauer et al. |
| 6,055,428 A | 4/2000 | Soliman |
| 6,073,021 A | 6/2000 | Kumar et al. |
| 6,084,969 A | 7/2000 | Wright et al. |
| 6,094,427 A | 7/2000 | Yi |
| 6,097,952 A | 8/2000 | Kawabata |
| 6,101,394 A | 8/2000 | Illidge |
| 6,137,787 A | 10/2000 | Chawla et al. |
| 6,144,671 A | 11/2000 | Perinpanathan et al. |
| 6,151,502 A | 11/2000 | Padovani et al. |
| 6,157,668 A | 12/2000 | Gilhousen et al. |
| 6,157,833 A | 12/2000 | Lawson-Jenkins et al. |
| 6,157,978 A | 12/2000 | Ng et al. |
| 6,161,008 A | 12/2000 | Lee et al. |
| 6,163,692 A | 12/2000 | Chakrabarti et al. |
| 6,195,552 B1 | 2/2001 | Jeong et al. |
| 6,195,705 B1 | 2/2001 | Leung |
| 6,201,971 B1 | 3/2001 | Purnadi et al. |
| 6,256,300 B1 | 7/2001 | Ahmed et al. |
| 6,272,129 B1 | 8/2001 | Dynarski et al. |
| 6,285,665 B1 | 9/2001 | Chuah |
| 6,300,887 B1 | 10/2001 | Le |
| 6,308,267 B1 | 10/2001 | Gremmelmaier |
| 6,345,043 B1 | 2/2002 | Hsu |
| 6,347,091 B1 | 2/2002 | Wallentin et al. |
| 6,360,100 B1 | 3/2002 | Grob et al. |
| 6,366,561 B1 | 4/2002 | Bender |
| 6,370,380 B1 | 4/2002 | Norefors et al. |
| 6,397,065 B1 | 5/2002 | Huusko et al. |
| 6,400,722 B1 | 6/2002 | Chuah et al. |
| 6,445,922 B1 | 9/2002 | Hiller et al. |
| 6,446,127 B1 | 9/2002 | Schuster et al. |
| 6,449,481 B1 | 9/2002 | Kwon et al. |
| 6,456,604 B1 | 9/2002 | Lee et al. |
| 6,466,964 B1 | 10/2002 | Leung et al. |
| 6,473,418 B1 | 10/2002 | Laroia et al. |
| 6,493,725 B1 | 12/2002 | Iwai et al. |
| 6,496,704 B2 | 12/2002 | Yuan |
| 6,510,153 B1 | 1/2003 | Inoue et al. |
| 6,516,352 B1 | 2/2003 | Booth et al. |
| 6,519,457 B1 | 2/2003 | Jiang et al. |
| 6,529,732 B1 | 3/2003 | Vainiomaki et al. |
| 6,535,493 B1 | 3/2003 | Lee et al. |
| 6,535,739 B1 | 3/2003 | Chen et al. |
| 6,553,227 B1 | 4/2003 | Ho et al. |
| 6,587,680 B1 | 7/2003 | Ala-Laurila et al. |
| 6,611,547 B1 | 8/2003 | Rauhala |
| 6,640,248 B1 | 10/2003 | Jorgensen |
| 6,654,363 B1 | 11/2003 | Li et al. |
| 6,671,512 B2 | 12/2003 | Laakso |
| 6,701,155 B2 | 3/2004 | Sarkkinen et al. |
| 6,708,031 B2 | 3/2004 | Purnadi et al. |
| 6,714,524 B1 | 3/2004 | Kim et al. |
| 6,714,777 B1 | 3/2004 | Naqvi et al. |
| 6,714,788 B2 | 3/2004 | Voyer |
| 6,728,365 B1 | 4/2004 | Li et al. |
| 6,754,492 B1 | 6/2004 | Stammers et al. |
| 6,763,007 B1 | 7/2004 | La Porta et al. |
| 6,768,908 B1 | 7/2004 | Jalloul et al. |
| 6,771,962 B2 | 8/2004 | Saifullah et al. |
| 6,785,256 B2 | 8/2004 | O'neill |
| 6,807,421 B1 | 10/2004 | Ahmavaara |
| 6,842,621 B2 | 1/2005 | Labun et al. |
| 6,842,630 B2 | 1/2005 | Periyalwar |
| 6,862,446 B2 | 3/2005 | ONeill et al. |
| 6,901,063 B2 | 5/2005 | Vayanos et al. |
| 6,917,605 B2 | 7/2005 | Kakemizu et al. |
| 6,937,566 B1 | 8/2005 | Forslow |
| 6,947,401 B2 | 9/2005 | El-Malki et al. |
| 6,950,650 B2 | 9/2005 | Roeder |
| 6,954,442 B2 | 10/2005 | Tsirtsis et al. |
| 6,961,579 B2 | 11/2005 | Inukai et al. |
| 6,965,585 B2 | 11/2005 | Grilli et al. |
| 6,970,445 B2 | 11/2005 | O'neill et al. |
| 6,990,088 B2 | 1/2006 | Madour |
| 6,990,337 B2 | 1/2006 | O'Neill et al. |
| 6,990,339 B2 | 1/2006 | Turanyi et al. |
| 6,990,343 B2 | 1/2006 | Lefkowitz |
| 6,992,994 B2 | 1/2006 | Das et al. |
| 6,993,332 B2 | 1/2006 | Pedersen et al. |
| 7,003,311 B2 | 2/2006 | Ebata et al. |
| 7,006,826 B2 | 2/2006 | Cao et al. |
| 7,016,317 B1 | 3/2006 | Pathak et al. |
| 7,027,400 B2 | 4/2006 | O'Neill |
| 7,027,449 B2 | 4/2006 | Garcia-Luna-Aceves et al. |
| 7,047,009 B2 | 5/2006 | Laroia et al. |
| 7,068,640 B2 | 6/2006 | Kakemizu et al. |
| 7,068,654 B1 | 6/2006 | Joseph et al. |
| 7,089,040 B2 | 6/2006 | Iwabuchi et al. |
| 7,079,511 B2 | 7/2006 | Abrol et al. |
| 7,089,008 B1 | 8/2006 | Back et al. |
| 7,116,654 B2 | 10/2006 | Kim |
| 7,123,599 B2 | 10/2006 | Yano et al. |
| 7,130,291 B1 | 10/2006 | Kim et al. |
| 7,155,236 B2 | 12/2006 | Chen et al. |
| 7,161,913 B2 | 1/2007 | Jung |
| 7,167,447 B2 | 1/2007 | Puuskari et al. |
| 7,177,641 B1 | 2/2007 | Miernik et al. |
| 7,184,771 B1 | 2/2007 | Mouly et al. |
| 7,197,318 B2 | 3/2007 | Schwarz et al. |
| 7,233,583 B2 | 6/2007 | Asthana et al. |
| 7,233,794 B2 | 6/2007 | Grob et al. |
| 7,263,357 B2 | 8/2007 | Lee et al. |
| 7,266,100 B2 | 9/2007 | Le et al. |
| 7,272,122 B2 | 9/2007 | Trossen et al. |
| 7,283,495 B2 | 10/2007 | Lee et al. |
| 7,283,511 B2 | 10/2007 | Hans et al. |
| 7,290,063 B2 | 10/2007 | Kalliokulju et al. |

(56) References Cited

U.S. PATENT DOCUMENTS

| | | |
|---|---|---|
| 7,315,554 B2 | 1/2008 | Baum et al. |
| 7,330,542 B2 | 2/2008 | Kauhanen et al. |
| 7,336,953 B2 | 2/2008 | Kim et al. |
| 7,369,855 B2 | 5/2008 | ONeill et al. |
| 7,369,859 B2 | 5/2008 | Gallagher |
| 7,376,101 B2 | 5/2008 | Shim et al. |
| 7,389,110 B2 | 6/2008 | Lee |
| 7,391,741 B2 | 6/2008 | Kang |
| 7,403,789 B2 | 7/2008 | Takano et al. |
| 7,408,917 B1 | 8/2008 | Kyung et al. |
| 7,408,950 B2 | 8/2008 | Okuyama |
| 7,409,428 B1 | 8/2008 | Brabec et al. |
| 7,418,264 B2 | 8/2008 | Kim |
| 7,420,957 B2 | 9/2008 | Kim et al. |
| 7,460,504 B2 | 12/2008 | Tsirtsis et al. |
| 7,492,762 B2 | 2/2009 | Chowdhury |
| 7,499,401 B2 | 3/2009 | Buddhikot et al. |
| 7,505,765 B2 | 3/2009 | Frangione et al. |
| 7,515,561 B2 | 4/2009 | Koodli et al. |
| 7,525,940 B2 | 4/2009 | Trossen et al. |
| 7,529,239 B2 | 5/2009 | Seppanen |
| 7,567,639 B2 | 7/2009 | Huh et al. |
| 7,583,592 B2 | 9/2009 | Park et al. |
| 7,593,364 B2 | 9/2009 | Asthana |
| 7,623,493 B2 | 11/2009 | Baba et al. |
| 7,653,415 B2 | 1/2010 | Van Rooyen |
| 7,668,541 B2 | 2/2010 | ONeill et al. |
| 7,672,254 B2 | 3/2010 | Kim et al. |
| 7,702,309 B2 | 4/2010 | Faccin et al. |
| 7,706,739 B2 | 4/2010 | Kjellberg |
| 7,729,350 B2 | 6/2010 | Singh et al. |
| 7,742,781 B2 | 6/2010 | Chen et al. |
| 7,773,947 B2 | 8/2010 | Gerlach |
| 7,962,142 B2 | 6/2011 | O'neill et al. |
| 8,112,102 B2 | 2/2012 | Fischer |
| 8,134,976 B2 | 3/2012 | Wallace et al. |
| 8,144,664 B2 | 3/2012 | Pani et al. |
| 8,165,587 B2 | 4/2012 | Dahlen et al. |
| 8,184,615 B2 | 5/2012 | Tsirtsis et al. |
| 8,229,120 B2 | 7/2012 | Iwamura et al. |
| 8,583,044 B2 | 11/2013 | Dua |
| 2001/0019545 A1 | 9/2001 | Okubo et al. |
| 2002/0061009 A1 | 5/2002 | Sorensen |
| 2002/0064144 A1 | 5/2002 | Einola et al. |
| 2002/0065785 A1 | 5/2002 | Tsuda |
| 2002/0067706 A1 | 6/2002 | Bautz et al. |
| 2002/0075859 A1 | 6/2002 | Mizell et al. |
| 2002/0082038 A1 | 6/2002 | Mochizuki |
| 2002/0085518 A1 | 7/2002 | Lim |
| 2002/0107908 A1 | 8/2002 | Dharanikota |
| 2002/0114308 A1* | 8/2002 | Takano et al. ................ 370/342 |
| 2002/0126701 A1 | 9/2002 | Requena |
| 2002/0136226 A1 | 9/2002 | Christoffel et al. |
| 2002/0161927 A1 | 10/2002 | Inoue et al. |
| 2002/0168982 A1 | 11/2002 | Sorokine et al. |
| 2002/0199012 A1 | 12/2002 | Cable et al. |
| 2003/0009580 A1 | 1/2003 | Chen et al. |
| 2003/0009582 A1 | 1/2003 | Qiao et al. |
| 2003/0018774 A1 | 1/2003 | Flinck et al. |
| 2003/0026220 A1 | 2/2003 | Uhlik et al. |
| 2003/0027572 A1 | 2/2003 | Karlsson et al. |
| 2003/0032430 A1 | 2/2003 | Lee |
| 2003/0036392 A1 | 2/2003 | Yukie |
| 2003/0078047 A1 | 4/2003 | Lee et al. |
| 2003/0092444 A1 | 5/2003 | Sengodan et al. |
| 2003/0101307 A1 | 5/2003 | Gemelli et al. |
| 2003/0103496 A1 | 6/2003 | Lakshmi Narayanan et al. |
| 2003/0104814 A1 | 6/2003 | Gwon et al. |
| 2003/0112766 A1 | 6/2003 | Riedel et al. |
| 2003/0119516 A1 | 6/2003 | Tomishima et al. |
| 2003/0204599 A1 | 10/2003 | Trossen et al. |
| 2003/0214922 A1 | 11/2003 | Shahrier |
| 2003/0216140 A1 | 11/2003 | Chambert |
| 2003/0217096 A1 | 11/2003 | McKelvie et al. |
| 2003/0227871 A1 | 12/2003 | Hsu et al. |
| 2003/0236103 A1 | 12/2003 | Tamaki et al. |
| 2004/0002362 A1 | 1/2004 | Chuah et al. |
| 2004/0004736 A1 | 1/2004 | Ogura et al. |
| 2004/0004967 A1 | 1/2004 | Nakatsugawa et al. |
| 2004/0008630 A1 | 1/2004 | Corson et al. |
| 2004/0008632 A1 | 1/2004 | Hsu et al. |
| 2004/0015607 A1 | 1/2004 | Bender et al. |
| 2004/0016551 A1 | 1/2004 | Bennett |
| 2004/0017792 A1 | 1/2004 | Khaleghi et al. |
| 2004/0017798 A1 | 1/2004 | Hurtta et al. |
| 2004/0018841 A1 | 1/2004 | Trossen |
| 2004/0076186 A1 | 4/2004 | Chen et al. |
| 2004/0087319 A1 | 5/2004 | Bos et al. |
| 2004/0090913 A1 | 5/2004 | Scudder et al. |
| 2004/0090937 A1 | 5/2004 | Chaskar et al. |
| 2004/0104544 A1 | 6/2004 | Fan et al. |
| 2004/0116153 A1 | 6/2004 | Kaminski et al. |
| 2004/0120317 A1 | 6/2004 | Forssell |
| 2004/0139201 A1 | 7/2004 | Chaudhary et al. |
| 2004/0151148 A1 | 8/2004 | Yahagi |
| 2004/0151193 A1 | 8/2004 | Rune et al. |
| 2004/0165551 A1 | 8/2004 | Krishnamurthi et al. |
| 2004/0166898 A1 | 8/2004 | Tajima |
| 2004/0179544 A1 | 9/2004 | Wilson et al. |
| 2004/0192307 A1 | 9/2004 | Watanabe et al. |
| 2004/0192390 A1 | 9/2004 | Tajima |
| 2004/0218607 A1 | 11/2004 | Hurtta et al. |
| 2004/0228301 A1 | 11/2004 | Rudolf et al. |
| 2004/0228304 A1 | 11/2004 | Riedel et al. |
| 2004/0242222 A1 | 12/2004 | An et al. |
| 2004/0253954 A1 | 12/2004 | Lee et al. |
| 2005/0020262 A1 | 1/2005 | Kim |
| 2005/0020265 A1 | 1/2005 | Funabiki et al. |
| 2005/0053043 A1 | 3/2005 | Rudolf et al. |
| 2005/0058151 A1 | 3/2005 | Yeh |
| 2005/0059417 A1 | 3/2005 | Zhang et al. |
| 2005/0063338 A1 | 3/2005 | Tsui |
| 2005/0063389 A1 | 3/2005 | Elliott et al. |
| 2005/0079823 A1 | 4/2005 | Kurek et al. |
| 2005/0089043 A1 | 4/2005 | Seckin et al. |
| 2005/0090260 A1 | 4/2005 | Semper et al. |
| 2005/0128949 A1 | 6/2005 | Ku et al. |
| 2005/0128990 A1 | 6/2005 | Eom et al. |
| 2005/0141468 A1 | 6/2005 | Kim et al. |
| 2005/0143072 A1 | 6/2005 | Yoon et al. |
| 2005/0201324 A1 | 9/2005 | Zheng |
| 2005/0265303 A1 | 12/2005 | Edwards et al. |
| 2005/0268153 A1 | 12/2005 | Armstrong et al. |
| 2006/0002344 A1 | 1/2006 | Ono et al. |
| 2006/0003768 A1 | 1/2006 | Chiou |
| 2006/0007936 A1 | 1/2006 | Shrum et al. |
| 2006/0029028 A1 | 2/2006 | Kim et al. |
| 2006/0056348 A1 | 3/2006 | Marinier et al. |
| 2006/0067526 A1* | 3/2006 | Faccin et al. .................... 380/46 |
| 2006/0069809 A1 | 3/2006 | Serlet |
| 2006/0089141 A1 | 4/2006 | Ho et al. |
| 2006/0099948 A1 | 5/2006 | Hoghooghi et al. |
| 2006/0099950 A1 | 5/2006 | Klein et al. |
| 2006/0104232 A1 | 5/2006 | Gidwani |
| 2006/0121883 A1 | 6/2006 | Faccin |
| 2006/0149845 A1 | 7/2006 | Malin et al. |
| 2006/0183479 A1 | 8/2006 | Liu et al. |
| 2006/0217119 A1 | 9/2006 | Bosch et al. |
| 2006/0221883 A1 | 10/2006 | Damnjanovic et al. |
| 2006/0230019 A1 | 10/2006 | Hill et al. |
| 2006/0268924 A1 | 11/2006 | Marinier et al. |
| 2006/0285520 A1 | 12/2006 | Venkitaraman |
| 2007/0016637 A1 | 1/2007 | Brawn et al. |
| 2007/0019584 A1 | 1/2007 | Qi et al. |
| 2007/0064948 A1 | 3/2007 | Tsirtsis et al. |
| 2007/0066918 A1 | 3/2007 | Dewald et al. |
| 2007/0076653 A1 | 4/2007 | Park et al. |
| 2007/0076658 A1 | 4/2007 | Park et al. |
| 2007/0078999 A1 | 4/2007 | Corson et al. |
| 2007/0083669 A1 | 4/2007 | Tsirtsis et al. |
| 2007/0086389 A1 | 4/2007 | Park et al. |
| 2007/0091810 A1 | 4/2007 | Kim et al. |
| 2007/0099618 A1 | 5/2007 | Kim |
| 2007/0105555 A1 | 5/2007 | Miernik et al. |

(56) References Cited

U.S. PATENT DOCUMENTS

| | | |
|---|---|---|
| 2007/0105584 A1 | 5/2007 | Grob et al. |
| 2007/0121542 A1 | 5/2007 | Lohr et al. |
| 2007/0147283 A1 | 6/2007 | Laroia et al. |
| 2007/0147286 A1 | 6/2007 | Laroia et al. |
| 2007/0147377 A1 | 6/2007 | Laroia et al. |
| 2007/0149126 A1 | 6/2007 | Rangan et al. |
| 2007/0149194 A1 | 6/2007 | Das et al. |
| 2007/0171875 A1 | 7/2007 | Suda |
| 2007/0189282 A1 | 8/2007 | Lohr et al. |
| 2007/0191054 A1 | 8/2007 | Das et al. |
| 2007/0191065 A1 | 8/2007 | Lee et al. |
| 2007/0195788 A1 | 8/2007 | Vasamsetti et al. |
| 2008/0019293 A1 | 1/2008 | Chang et al. |
| 2008/0031198 A1 | 2/2008 | Hwang et al. |
| 2008/0051091 A1 | 2/2008 | Phan et al. |
| 2008/0074994 A1 | 3/2008 | Jen |
| 2008/0076424 A1 | 3/2008 | Barber et al. |
| 2008/0089287 A1 | 4/2008 | Sagfors et al. |
| 2008/0146231 A1 | 6/2008 | Huang et al. |
| 2008/0160999 A1 | 7/2008 | Eklund |
| 2008/0240039 A1 | 10/2008 | Parekh et al. |
| 2008/0242292 A1 | 10/2008 | Koskela et al. |
| 2008/0253332 A1 | 10/2008 | Ore et al. |
| 2008/0259855 A1 | 10/2008 | Yoon et al. |
| 2008/0261600 A1 | 10/2008 | Somasundaram et al. |
| 2009/0029706 A1 | 1/2009 | Prakash et al. |
| 2009/0046573 A1 | 2/2009 | Damnjanovic |
| 2009/0175448 A1 | 7/2009 | Watanabe et al. |
| 2009/0181673 A1 | 7/2009 | Barrett |
| 2009/0190556 A1 | 7/2009 | Venkitaraman |
| 2009/0191878 A1 | 7/2009 | Hedqvist et al. |
| 2009/0274086 A1 | 11/2009 | Petrovic et al. |
| 2009/0285218 A1 | 11/2009 | Adamczyk et al. |
| 2010/0080126 A1 | 4/2010 | Higashida |
| 2011/0019614 A1 | 1/2011 | ONeill et al. |
| 2011/0039546 A1 | 2/2011 | Narasimha et al. |
| 2011/0039552 A1 | 2/2011 | Narasimha et al. |
| 2011/0051660 A1 | 3/2011 | Arora et al. |
| 2011/0103347 A1 | 5/2011 | Dimou |
| 2011/0250892 A1 | 10/2011 | Gupta et al. |
| 2011/0268085 A1 | 11/2011 | Barany et al. |
| 2012/0327908 A1 | 12/2012 | Gupta et al. |
| 2013/0208709 A1 | 8/2013 | Corson et al. |
| 2013/0294324 A1 | 11/2013 | Corson et al. |
| 2015/0030003 A1 | 1/2015 | O'Neill et al. |

FOREIGN PATENT DOCUMENTS

| | | |
|---|---|---|
| CN | 1043052 A | 6/1990 |
| CN | 1344477 A | 4/2002 |
| CN | 1345518 A | 4/2002 |
| CN | 1416284 A | 5/2003 |
| CN | 1481119 A | 3/2004 |
| CN | 1514607 | 7/2004 |
| CN | 1859529 A | 11/2006 |
| EP | 0740440 A2 | 10/1996 |
| EP | 0813346 A1 | 12/1997 |
| EP | 0974895 A2 | 1/2000 |
| EP | 1088463 A1 | 4/2001 |
| EP | 1128704 A1 | 8/2001 |
| EP | 1345370 A2 | 9/2003 |
| EP | 0926608 B1 | 3/2004 |
| EP | 1458209 A2 | 9/2004 |
| EP | 1473872 A2 | 11/2004 |
| EP | 1489808 A2 | 12/2004 |
| EP | 1507421 A1 | 2/2005 |
| EP | 1565024 A2 | 8/2005 |
| EP | 1720267 A1 | 11/2006 |
| EP | 1764942 A2 | 3/2007 |
| GB | 2322046 | 8/1998 |
| GB | 2395629 A | 5/2004 |
| JP | 2084807 | 3/1990 |
| JP | 08116329 | 5/1996 |
| JP | 11308273 | 11/1999 |
| JP | H11341541 A | 12/1999 |
| JP | 2000125343 A | 4/2000 |
| JP | 2001217830 A | 8/2001 |
| JP | 2001237878 A | 8/2001 |
| JP | 2001245355 A | 9/2001 |
| JP | 2002111732 A | 4/2002 |
| JP | 2002513527 A | 5/2002 |
| JP | 2002165249 A | 6/2002 |
| JP | 2002281069 A | 9/2002 |
| JP | 2002281539 A | 9/2002 |
| JP | 2002537739 | 11/2002 |
| JP | 2003060685 A | 2/2003 |
| JP | 2003111134 A | 4/2003 |
| JP | 2003348007 | 5/2003 |
| JP | 2003304571 A | 10/2003 |
| JP | 2003338833 A | 11/2003 |
| JP | 2004007578 A | 1/2004 |
| JP | 2004104544 A | 4/2004 |
| JP | 2004147228 | 5/2004 |
| JP | 2004187256 A | 7/2004 |
| JP | 2004201289 A | 7/2004 |
| JP | 2004297130 A | 10/2004 |
| JP | 2004328637 A | 11/2004 |
| JP | 2005531173 T | 10/2005 |
| JP | 2007527177 T | 9/2007 |
| JP | 2008053889 A | 3/2008 |
| JP | 4827994 B1 | 11/2011 |
| KR | 20040004918 | 1/2004 |
| KR | 20040105069 A | 12/2004 |
| KR | 20050023194 A | 3/2005 |
| KR | 20050065123 | 6/2005 |
| KR | 20050066287 A | 6/2005 |
| KR | 20070031810 A | 3/2007 |
| RU | 2117396 C1 | 8/1998 |
| RU | 2256299 C2 | 7/2005 |
| RU | 2292669 | 1/2007 |
| RU | 2294596 C2 | 2/2007 |
| TW | 200527930 | 8/2005 |
| WO | 9501706 A1 | 1/1995 |
| WO | 9804094 A1 | 1/1998 |
| WO | 9833288 | 7/1998 |
| WO | 9847302 | 10/1998 |
| WO | 9856140 A2 | 12/1998 |
| WO | 9905828 A1 | 2/1999 |
| WO | 9927718 | 6/1999 |
| WO | 9986748 A1 | 12/1999 |
| WO | 0041426 A1 | 7/2000 |
| WO | 0128160 A2 | 4/2001 |
| WO | 0158196 A1 | 8/2001 |
| WO | 0163947 | 8/2001 |
| WO | 0219746 A1 | 3/2002 |
| WO | 0243409 A2 | 5/2002 |
| WO | 02056551 A1 | 7/2002 |
| WO | 03007484 A2 | 1/2003 |
| WO | 03017582 | 2/2003 |
| WO | 03092316 A1 | 11/2003 |
| WO | 03098816 A2 | 11/2003 |
| WO | 03105516 A1 | 12/2003 |
| WO | 2004039022 A2 | 5/2004 |
| WO | 2004068739 A1 | 8/2004 |
| WO | 2004079949 A1 | 9/2004 |
| WO | 2004105272 A1 | 12/2004 |
| WO | 2004107638 A2 | 12/2004 |
| WO | 2004114695 A1 | 12/2004 |
| WO | 2005048629 A1 | 5/2005 |
| WO | WO-2005078966 A1 | 8/2005 |
| WO | 2005084146 A2 | 9/2005 |
| WO | 2005120183 A2 | 12/2005 |
| WO | 2006002676 A1 | 1/2006 |
| WO | 2006083131 A1 | 8/2006 |
| WO | 2008113373 A1 | 9/2008 |
| WO | 2008131401 A1 | 10/2008 |

OTHER PUBLICATIONS

Zte, et al., "Handover Cause Report for Mobility Robustness Optimization", 3GPP DRAFT; R3-092982, 3rd Generation Partnership Project (3GPP), Mobile Competence Centre ; 650, Route Des Lucioles ; F-06921 Sophia-Antipolis Cedex ; France, no. Jeju: Nov. 9, 2009, XP050392455, 4 pgs, retrieved on Nov. 19, 2009.

(56) References Cited

OTHER PUBLICATIONS

3GPP, "3rd Generation Partnership Project, Technical Specification Group Radio Access Network, E-UTRAN Mobility Evaluation and Enhancement, (Release 9)", 3GPP Draft, R1-090856 TP for TR for Mobility Studies, 3rd Generation Partnership Project (3GPP), Mobile Competence Centre, 650, Route Des Lucioles, F-06921 Sophia-Antipolis Cedex, France no. Athens, Greece, Feb. 3, 2009, 16 pgs., XP050318707.
3GPP TS 36.423, "3rd Generation Partnership Project; Technical Specification Group Radio Access Network; Evolved Universal Terrestrial Radio Access (E UTRA) and Evolved Universal Terrestrial Radio Access Network (EUTRAN); X2 Application Protocol (X2AP)", version 0.0.1, Release 8, year 2007, pp.9.
3rd Generation Partnership Project; Technical Specification Group Radio Access Network; Evolved Universal Terrestrial Radio Access (E-UTRA) and Evolved Universal Terrestrial Radio Access Network (E-UTRAN); Overall description; Stage 2 (Release 9), 3GPP Standard: 3GPP TS 36.300, 3rd Generation Partnership Project (3GPP), Mobile Competence Centre ; 650, Route Des Lucioles ; F-06921 Sophia-Antipolis Cedex ; France, no. V9.2.0, Jan. 7, 2010, pp. 1-178, XP050401821, [retrieved on Feb. 21, 2010].
"3rd Generation Partnership Project; Technical Specification Group Radio Access Network; Evolved Universal Terrestrial Radio Access (E-UTRA) Radio Resource Control (RRC); Protocol specification (Release 8)" 3GPP Standard; 3GPP TS 36.331, 3rd Generation Partnership Project (3GPP), Mobile Competence Centre; 650, Route Des Lucioles : F-06921 Sophia-Antipolis Cedex; France, no. V8.2.0, May 1, 2008, pp. 1-151, XP050377645.
3rd Generation Partnership Project; Technical Specification Group Radio Access Network; Evolved Universal Terrestrial Radio Access (E-UTRA) Radio Resource Control (RRC); Protocol specification (Release 9), 3GPP Standard: 3GPP TS 36.331, 3rd Generation Partnership Project (3GPP), Mobile Competence Centre ; 650, Route Des Lucioles ; F-06921 Sophia-Antipolis Cedex ; France, no. V9.1.0, Jan. 7, 2010, pp. 1-221, XP050401822, [retrieved on Jan. 7, 2010].
Baker, F., "RSVP Management Information Base Using SMlv2," Network Working Group, Request for Comments: 2206, pp. 1-64 (Sep. 1997).
Basic Knowledge of Communications Term of Switching HUB, Nov. 9, 2006, 2 pgs.
Berger, L., et al., "RSVP Extensions for IPSEC Data Flows, " IETF, Network Working Group, Request for Comments: 2207, pp. 1-14 (Sep. 1997).
Berger, L., "RSVP Refresh Overhead Reduction Extensions," IETF Network Working Group, Request for Comments: 2961, pp. 1-34 (Apr. 2001).
Bos et al., "A Framework for End-to-End Perceived Quality of Service Negotiation", IETF Internal Draft, draft-bos-mmusic-sdpqos-framework-00.txt, Nov. 2001, pp. 1-22.
Braden, R., "Resource ReSerVation Protocol (RSVP)—Ver. 1 Message Processing Rules," IETF, Network Working Group, Request for Comments 2209, pp. 1-25 (Sep. 1997).
Braden, R., "Resource ReSerVation Protocol (RSVP)—Ver. 1 Functional Specification", IETF, Network Working Group, Request for Comments. 2205, pp. 1-112 (Sep. 1997).
Camarillo, G., et el., "Integration of Resource Management and SIP," IETF Internet Draft, draft-ietf-sip-manyfolks-resource-04.ps, Feb. 25, 2002, pp. 1-18.
Campbell, Andrew T. et al., "IP Micro-Mobility Protocols", Mobile Computing and Communications Review (MC2R), vol. 4, No. 4, pp. 45-53, (Oct. 2001).
Co-pending U.S. Appl. No. 08/144,901, filed Oct. 28, 1993.
Droms, R.; "Dynamic Host Configuration Protocol," IETF Standard, RFC 2131, Internet Engineering Task Force IETF, CH, pp. 1-45,(Mar. 1997) XP015007915.
ETRI, "Source Specific Multicast (SSM) Explicit Multicast (Xcast)" pp. 1-27 (Jun. 28, 2001).
Ho, Michael. "Integration AAA with Mobile IPv4", Internet Draft pp. 1-59, Apr. 2002.
Huawei, et al., "Clarification of definitions of HO failure cases", RAN3, SGPP DRAFT; 36300_CR0202_(REL-9)_R2-101906_ R3-100635, 3rd Generation Partnership Project (3GPP), Mobile Competence Centre : 650, Route Des Lucioles ; F-06921 Sophia-Antipolis Cedex : France. vol. RAN WG2, no. San Francisco, USA; Feb. 22, 2010, Mar. 4, 2010, XP050422194, 3 pgs. [retrieved on Mar. 4, 2010].
Ian F.A., et al., "Mobility Management in Next-Generation Wireless Systems", Proceedings of the IEEE, IEEE. New York, us, vol. 87, No. 8, Aug. 1, 1999, XP011044241, ISSN. 0018-9219. pp. 1347-1384.
International Search Report with Written Opinion of International Searching Authority, dated May 21, 2007, from International Application No. PCT/US2006/048916: pp. Jan. 10, 2010.
Johnson, D., et al., IETF Mobile IP Working Group, "Mobility Support in IPv6,"; Feb. 26, 2003 Downloaded From http://www.join.uni-muenster.de on Dec. 29, 2004, pp. 1-169.
Karagiannis, Georgios, "Mobile IP: State of the Art Report," Ericsson, No. 3/0362-FCP NB 102 88 UEN, pp. 1-63, (Jul. 13, 1999).
Koodli, R. et al.: "Fast Handovers and Context Transfers in Mobile Networks" Computer Communication Review, ACM, New York, NY, US, vol. 31, No. 5, Oct. 1, 2001, pp. 37-47, XP001115324 ISSN: 0146-4833 abstract p. 2, right-hand column, last paragraph—p. 3, left-hand column, paragraph 3 p. 5, right-hand column, last paragraph—p. 7, right-hand column, last paragraph.
Leon-Garcia, Alberto; "Communication Networks: Fundamental Concepts and Key Architectures." McGraw-Hill; 2nd Edition; Copyright 2004, pp. 44-52, 429-431.
Li, Yalun et al. "Protocol Architecture for Universal Personal Computing," IEEE Journal on Selected Areas in Communications, IEEE Inc. New York, US, vol. 15, No. 8, Oct. 1, 1997, pp. 1467-1476, XP000721278 ISSN: 0733-8716.
Loughney, J. et al. "Context Transfer Protocol (CXTP)" IETF Standard, Request for Comments: 4067, Internet Engineering Task Force, IETF, CH, Jul. 2005, XP015041932 ISSN: 0000-0003 pp. 1 to 33.
Manikin , A., et al., "Resource ReSerVation Protocol (RSVP) Version 1, Applicability Statement: Some Guidelines on Deployment", IETF, Network Working Group, Request for Comments: 2208, pp. 1-6 (Sep. 1997).
Marshall, W. et al, "Integration of Resource Management and SIP: SIP Extensions for Resource Management," IETF Internet Draft, draft-ietf-sip-manyfolks-resource-02.txt, Aug. 2001, pp. 1-28.
Miorandi D., et al., "Analysis of master-slave protocols for real-time industrial communications over IEEE 802.11 WLANs" Industrial Informatics, 2004. INDIN '04, 2nd IEEE International Conference on Berlin, Germany Jun. 24-26, 2004. Piscataway, NJ, USAIEEE, Jun. 24, 2004, pp. 143-148, XP010782619, ISBN 0789385136, Para 3, point B.
Mockapetris P., "Domain Names—Implentation and Specification", IETF RFC 1035, Nov. 1987.
Moy, J., "OSPF Version 2", Network Working Group, Request for Comments: 2328, pp. 1-244 (Apr. 1998).
"Network Layer Protocol," Jul. 13, 2002, chap. 6, pp. 1-35, URL: http://www2.yamanashi-ken.ac.jp/~itoyo/lecture/network/network06/index06.htm.
Nortel: "Forward Hand-Off options", R2-071980, 3GPP TSG-RAN WG2 Meeting #58, Kobe, Japan, May 7-11, sections 2-3.
Panasonic, "Necessity of forward handover", 3GPP Draft, R2-062146, 3rd Generation Partnership Project (3GPP), Mobile Competence Centre, 650, Route Des Lucioles, F-06921 Sophia-Antipolis Cedex, France, vol. RAN WG2, no. Tallinn, Aug. 23, 2006, XP050131764.
Papalilo, D. et al. "Extending SIP for QoS Support", www.coritel.it/publications/IP_download/papallo-salsano-veltri.pdf, Dec. 8, 2001, pp. 1-6.
Perkins, C., "IP Mobility Support for IPv4", Nokia Research Center, Network Working Group, Request for Comments: 3220, Jan. 2002, downloaded from http://www.ietf.org on Dec. 29, 2004, pp. 1-92.
Perkins, C., "IP Mobility Support", IBM, Network Working Group, Request for Comments: 2002, pp. 1-79 (Oct. 1996).
Pollini, G P et al., "Trends in Handover Design" IEEE 34(3), pp. 82-90, Mar. 1, 1996, XP00557380.
Rosenberg J et al:RFAC 3261: "SIP: Session Initiation Protocol" 20020601; 20020600, Jun. 1, 2002, pp. 1-269, XP015009039.

(56) References Cited

OTHER PUBLICATIONS

Schulzrinne et al., "Application-Layer Mobility Using SIP". 0-7803-7133 IEEE, pp. 29-36, Jan. 2000.

Taiwan Search Report—TW095148271—TIPO—Jan. 14, 2013.

Takako Mita, et al., A Proposal for Seamless QoS Support in Mobile Networks, Research Report of Information Processing Society 2004-MBL-29, Japan, Information Processing Society of Japan, May 13, 2004, vol. 2004, No. 44. pp. 129-134.

"Terms for Use in Textbooks and Lectures on Distributed Computing," Feb. 13, 2005, URL: http://web.archive.org/web/20050213090736/http://www.nuis.ac.jp/~nagai/lecture/dce.html.

Thulasi, A., et al., "IPv6 Prefix Delegation Using ICMPv6", Network Working Group, Hewlett-Packard, pp. 1-34, Apr. 2004.

TIA/EIA/IS-707A.8 "Data Serice Options for Spread Spectrum Systems: Radio Link Protocol Type 2" pp. 1-1:4:12 (Mar. 1999).

Trossen, D. et al., "A Dynamic Protocol for Candidate Access-Router Discovery", 35 pgs., Mar. 14, 2003.

Valko, A.G. et al.: "Cellular IP: A New Approach to Interenet Host Mobility" Computer Communication Review, Association for Computing Machinery, New York, US vol. 29, No. 1, Jan. 1999, pp. 50-65, XP000823873 ISSN: 0146-4833, p. 56, Line 7-Line13.

Wedlund et al: "Mobility Support Using SIP", Proc. of ACM/IEEE International Conference on Wireless and Mobile Multimedia (WoWMoM '99), Seattle, Washington, Aug. 1999.

Wroclawski, J., "The Use of RSVP with IETF Integrated Services," IETF, Network Working Group, Request for Comments: 2210, pp. 1-33 (Sep. 1997).

Evolved Universal Terrestrial Radio Access (E-UTRA) and Evolved Universal Terrestrial Radio Access Network (E-UTRAN); Overall description; Stage 2 (Release 9), 3GPP TS 36.300 V9.2.0, Dec. 2009, pp. 56-61, Retrieved from the internet: URL: http://www.3gpp.org/ftp/Specs/archive/36_series/36.300/36300-920.zip.

Qualcomm Europe, T-Mobile, "Network based solutions to inbound mobility in the presence of PCI confusion", 3GPP TSG-RAN WG3 #64, R3-091027, May 2008, pp. 1-4, Retrieved from the internet: URL: http://www.3gpp.org/ftp/tsg_ran/WG3_lu/TSGR3_64/Docs/R3-091027.zip.

Qualcomm Incorporated, "UE context fetch procedure stage 2", 3GPP TSG-RAN WG3 Meeting #67, R3-100893, Feb. 2010, pp. 1-4, Retrieved from the internet URL: http://www.3gpp.org/ftp/tsg_ran/WG3_lu/TSGR3_67/Docs/R3-100893.zip.

* cited by examiner

Link Layer Message with optional
CID Destination/Source Address

METHOD AND APPARATUS FOR END NODE ASSISTED NEIGHBOR DISCOVERY

This application is a continuation of application Ser. No. 11/316,603, filed Dec. 22, 2005, now pending, wherein the disclosure of application Ser. No. 11/316,603 is incorporated by reference herein in its entirety.

FIELD OF THE INVENTION

This invention relates to communications system and, more particularly, to methods and apparatus for routing messages based on physical layer information in wireless, e.g., cellular, communications networks.

BACKGROUND OF INVENTION

The Open System Interconnection (OSI) reference model is useful in explaining various communications and routing operations. The OSI reference model includes 7 layers with the application layer being the top most layer and the Physical Layer being the lowest layer. The physical layer is the layer which deals with actual physical connections and attributes of the physical connections in the system. Above the physical layer is a Data Link layer, sometimes referred to as the link layer. The link layer (Layer 2 in the OSI model) is sometimes described as a technology specific transfer layer. Above the link layer is the network layer (OSI Layer 3) where network routing and relaying is supported. The network layer is sometimes referred to as the packet layer. It is at the network layer that routing of messages/packets through the network is performed, e.g., on one or more paths. Different addressing may be used for directing messages and signals at the different levels. For example, a network address such as an IP address, maybe used for routing messages/packets at the network layer level. MAC addresses maybe use for controlling routing of messages at the data link layer level. At the lowest level of the OSI model, the physical level, one or more physical identifiers have a relationship to an actual physical attribute or characteristic of a source or destination device. An understanding of the different communication layers and different addressing techniques used for each of the layers will facilitate an understanding of the present invention.

Communications systems frequently include a plurality of network nodes which are coupled to access nodes through which end nodes, e.g., mobile devices, are coupled to the network. Network nodes may be arranged in a hierarchy. End nodes typically communicate with access nodes directly through connections that have been established with said access nodes. Such systems usually rely on the existence of a bidirectional communications link between an access node and end not to support two way communications between an end node and an access node. Note that in such systems the end node normally does not know the network layer address of a target destination access node but may be cognizant of information that it can receive over broadcast channels which typically can include physical layer identifier that are normally not used in such systems for message routing. This approach results in handoff delays and packet loss when the end node is only able to maintain one single bidirectional communications link at the time.

It should then be appreciated that there is a need for methods and apparatus that allows an end node that has no current uplink communications link to a target access node to communicate with said target access node via another access node with which the end node has a current uplink communications link even when said end node does not know the network address of the target access node.

In some systems end nodes are capable of maintaining multiple bidirectional communications links with different access nodes at the same time. However, such systems typically require the end nodes to send messages intended for a specific access node, with which an end node has a connection, over the link that is directly connected to that specific access node. This approach, in some cases, is inefficient since links, especially when they are wireless links, tend to fluctuate in terms of quality (e.g., delay and loss characteristics). As a result the link to the target destination access node may not be the best link available to the end node at the time a message to said target destination access node needs to be sent. Typically this limitation is overcome by resorting to network layer communications that can be routed via multiple hops due to the use of network layer addresses (e.g., IP addresses). This approach of using network layer addresses is also inefficient especially when the messaging has to do with link layer specific functions, since network layer messages tend to be much larger than link layer messages in some systems. Such inefficient signaling is not well suited for communications over resource restricted air links.

Access nodes that are serving neighboring geographical cells are typically known to each other via manual configuration. During such configuration, various parameters are configured in an access node corresponding to several of its neighbors. Such configuration is typically labor intensive and error prone not only due to possible human error but also due to the fact that the network layout of a wireless network often changes by network expansion or even due to environmental conditions. This is particularly relevant to a gradual phased deployment of a wireless communications system. It should then be appreciated that, there is a need for end node assisted neighbor discovery processes so that access nodes can exchange neighbor information in response to end node signaling, as the end nodes move throughout the system and encounter newly deployed nodes, rather than by manual configuration techniques.

SUMMARY OF THE INVENTION

The present invention is directed to, among other things, to method of using end nodes, e.g., wireless terminals, to discover base stations and communicate information about discovered access nodes, e.g., base stations, to other access nodes in a system. Thus, various embodiments of the present invention are directed to wireless terminal based methods of supporting neighbor discovery in a communications system including a plurality of access nodes. As the wireless terminal roams in the system and new access nodes are encountered, one or more physically adjacent access nodes will be informed of the presence of the new access node as a result of communications with the wireless terminal.

In some but not necessarily all implementations, a failure of an access node to route a message from an end node to another access node is used to trigger various signals used to provide updated routing information to the access node which failed to complete the routing operation. In this manner, an access node can have its routing information updated to include routing information corresponding to access nodes which were encountered by an end node but which the access node was not previously aware or lacked adequate routing information.

By automating all or a portion of the access node discovery process, the methods and apparatus of the present invention make phased deployment of access nodes easier than in systems where access nodes must be manually programmed and/or supplied with information about their neighbors as part of the process of deploying a new base station. In addition, since the neighbor discovery and updating process occurs with little or no direct administrator involvement, the methods and apparatus of the present invention are particularly well suited for systems where the entire network may not be under control of a single administrator and individuals may freely add access nodes, e.g., base stations, at will, without first notifying other base station administrators of the introduction of a new base station into the system.

Thus various features of the invention are directed to end node methods of receiving signals from access nodes indicating an identifier to access node address resolution failure and causing said end node to send neighbor notification messages for the establishment of new access node neighbors.

While some features are directed to wireless terminal methods and apparatus, as well as to novel messages of the invention stored in a wireless terminal, other features are directed to novel access node methods and apparatus. The invention is also directed to data storage devices, e.g., memory devices, which store one or more of the novel messages of the present invention.

While various embodiments have been discussed in the summary above, it should be appreciated that not necessarily all embodiments include the same features and some of the features described above are not necessary but can be desirable in some embodiments. Numerous additional features, embodiments and benefits of the present invention are discussed in the detailed description which follows.

DETAILED DESCRIPTION

The methods and apparatus of the present invention for routing messages based on physical layer information, e.g., physical layer indentifiers, which can be used to support communications sessions with one or more end nodes, e.g., mobile devices. The method and apparatus of the invention can be used with a wide range of communications systems. For example the invention can be used with systems which support mobile communications devices such as notebook computers equipped with modems, PDAs, and a wide variety of other devices which support wireless interfaces in the interests of device mobility.

Figure 1:
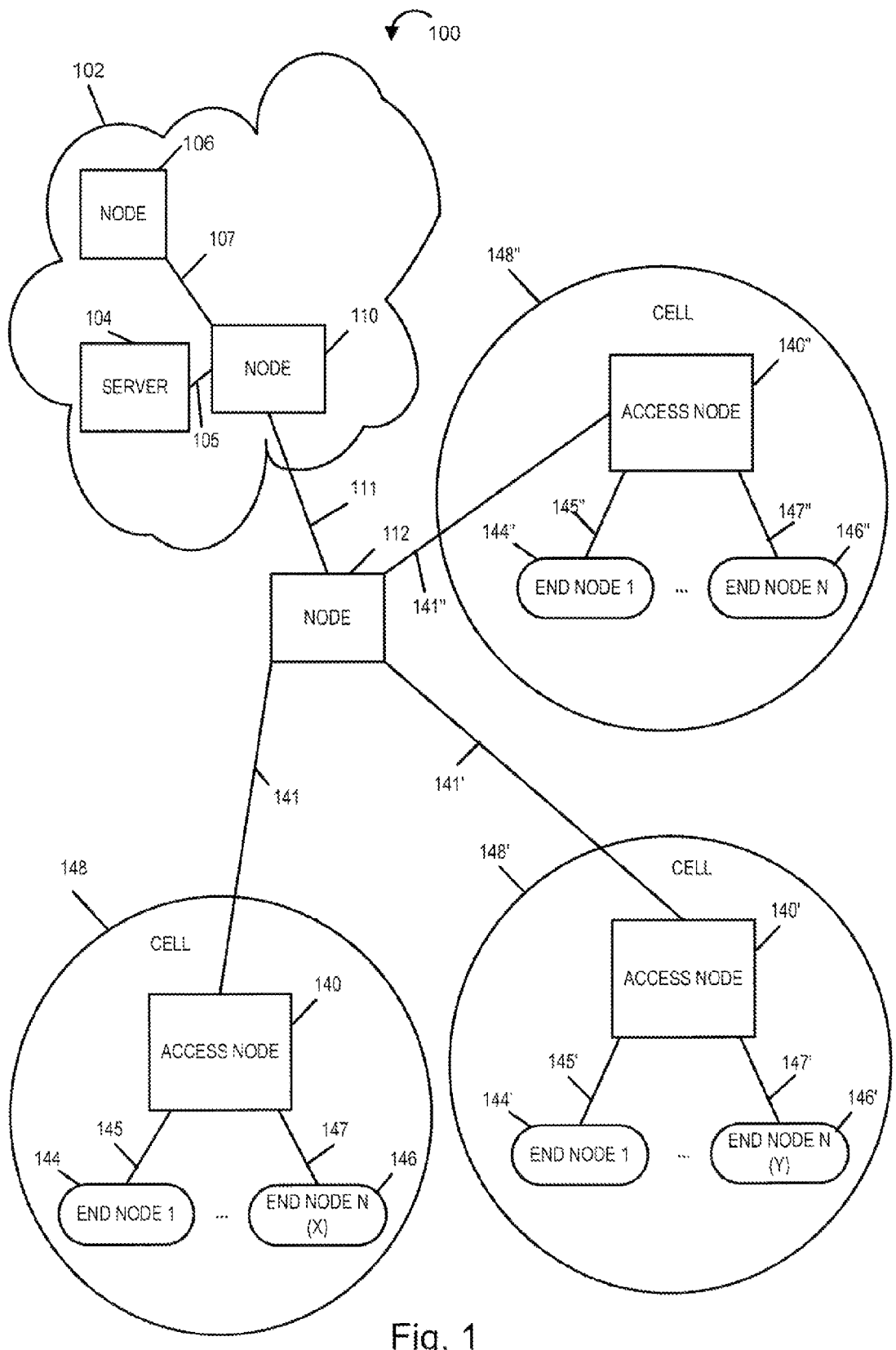
FIG. 1 illustrates a network diagram of an exemplary communications system implemented in accordance with the present invention.

FIG. 1 illustrates an exemplary communication system 100 implemented in accordance with the present invention, e.g., a cellular communication network, which comprises a plurality of nodes interconnected by communications links. Exemplary communications system 100 is, e.g., a multiple access spread spectrum orthogonal frequency division multiplexing (OFDM) wireless communications system. Nodes in the exemplary communication system 100 exchange information using signals, e.g., messages, based on communication protocols, e.g., the Internet Protocol (IP). The communications links of the system 100 may be implemented, for example, using wires, fiber optic cables, and/or wireless communications techniques. The exemplary communication system 100 includes a plurality of end nodes 144, 146, 144', 146', 144", 146", which access the communication system via a plurality of access nodes 140, 140', 140". The end nodes 144, 146, 144', 146', 144", 146" may be, e.g., wireless communication devices or terminals, and the access nodes 140, 140', 140" may be, e.g., base stations. The base stations may be implemeneted as wireless access routers. The exemplary communication system 100 also includes a number of other nodes 104, 106, 110, and 112, used to provide interconnectivity or to provide specific services or functions. Specifically, the exemplary communication system 100 includes a Server 104, used to support transfer and storage of state pertaining to end nodes. The Server node 104 may be, for example, an AAA server, or it may be a Context Transfer Server, or it may be a server including both AAA server functionality and Context Transfer server functionality.

The FIG. 1 exemplary system 100 depicts a network 102 that includes the Server 104 and the node 106, which are connected to an intermediate network node 110 by a corresponding network link 105 and 107, respectively. The intermediate network node 110 in the network 102 also provides interconnectivity to network nodes that are external from the perspective of the network 102 via network link 111. Network link 111 is connected to another intermediate network node 112, which provides further connectivity to a plurality of access nodes 140, 140', 140" via network links 141, 141', 141", respectively.

Each access node 140, 140', 140" is depicted as providing connectivity to a plurality of N end nodes (144, 146), (144', 146'), (144", 146"), respectively, via corresponding access links (145, 147), (145', 147'), (145", 147"), respectively. In the exemplary communication system 100, each access node 140, 140', 140" is depicted as using wireless technology, e.g., wireless access links, to provide access. A radio coverage area, e.g., communications cell, 148, 148', 148" of each access node 140, 140', 140", respectively, is illustrated as a circle surrounding the corresponding access node.

The exemplary communication system 100 is subsequently used as a basis for the description of various embodiments of the invention. Alternative embodiments of the invention include various network topologies, where the number and type of network nodes, the number and type of access nodes, the number and type of end nodes, the number and type of Servers and other Agents, the number and type of links, and the interconnectivity between nodes may differ from that of the exemplary communication system 100 depicted in FIG. 1.

In various embodiments of the present invention some of the functional entities depicted in FIG. 1 may be omitted or combined. The location or placement of these functional entities in the network may also be varied.

Figure 2:
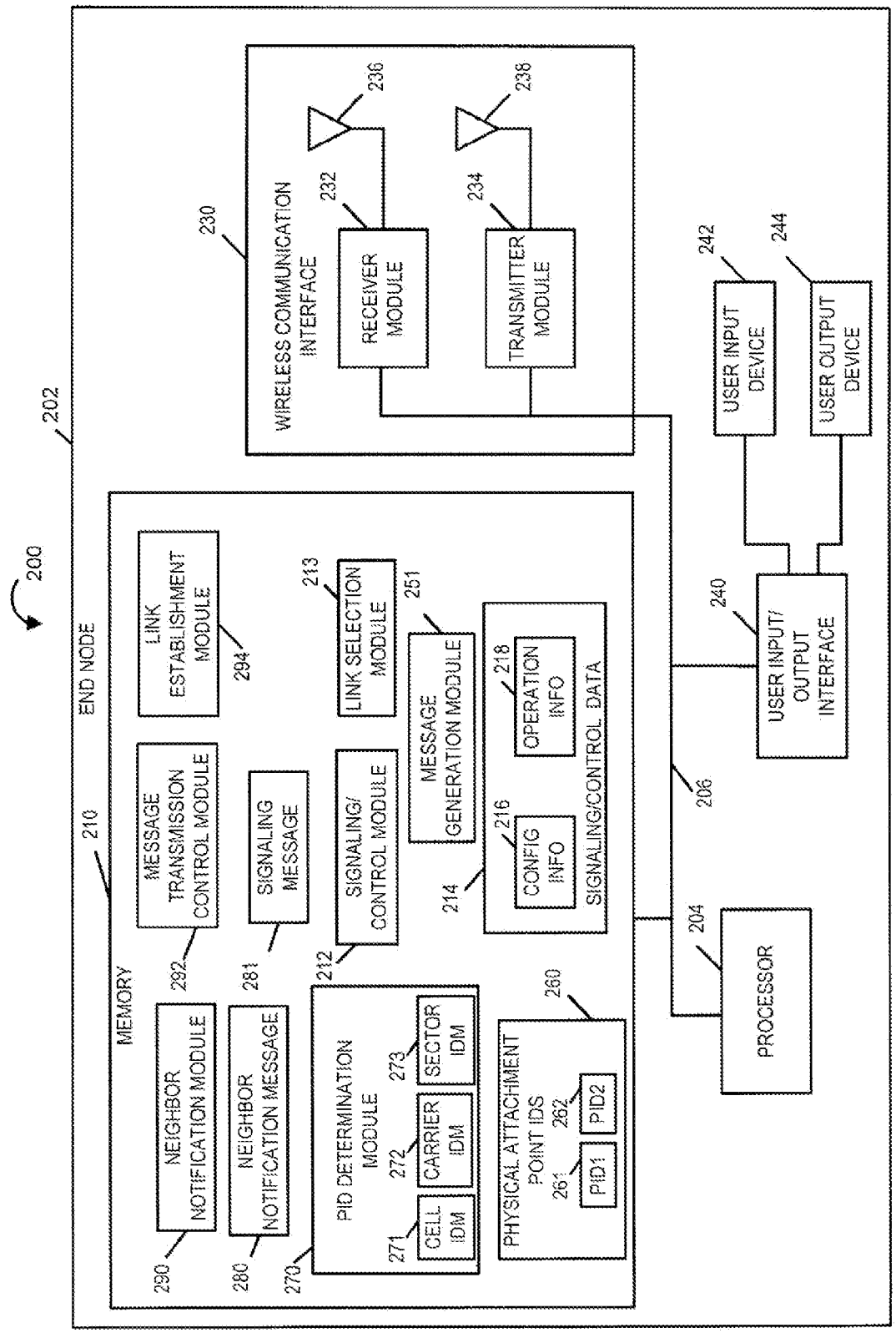
FIG. 2 illustrates an exemplary end node implemented in accordance with the present invention.

FIG. 2 provides a detailed illustration of an exemplary end node 200, e.g., wireless terminal such as a mobile node, implemented in accordance with the present invention. The exemplary end node 200, depicted in FIG. 2, is a detailed representation of an apparatus that may be used as any one of the end nodes 144, 146, 144', 146', 144", 146", depicted in FIG. 1. In the FIG. 2 embodiment, the end node 200 includes a processor 204, a wireless communication interface 230, a user input/output interface 240 and memory 210 coupled together by bus 206. Accordingly, via bus 206 the various components of the end node 200 can exchange information, signals and data. The components 204, 206, 210, 230, 240 of the end node 200 are located inside a housing 202.

The wireless communication interface 230 provides a mechanism by which the internal components of the end node 200 can send and receive signals to/from external devices and network nodes, e.g., access nodes. The wireless communication interface 230 includes, e.g., a receiver module 232 with a corresponding receiving antenna 236 and a transmitter module 234 with a corresponding transmitting antenna 238 used for coupling the end node 200 to other network nodes, e.g., via wireless communications channels. In some embodiments, the transmitter module 234 includes an orthogonal frequency division multiplexing (OFDM) transmitter.

The exemplary end node 200 also includes a user input device 242, e.g., keypad, and a user output device 244, e.g., display, which are coupled to bus 206 via the user input/output interface 240. Thus, user input/output devices 242, 244 can exchange information, signals and data with other components of the end node 200 via user input/output interface 240 and bus 206. The user input/output interface 240 and associated devices 242, 244 provide a mechanism by which a user can operate the end node 200 to accomplish various tasks. In particular, the user input device 242 and user output device 244 provide the functionality that allows a user to control the end node 200 and applications, e.g., modules, programs, routines and/or functions, that execute in the memory 210 of the end node 200.

The processor 204 under control of various modules, e.g., routines, included in memory 210 controls operation of the end node 200 to perform various signaling and processing as discussed below. The modules included in memory 210 are executed on startup or as called by other modules. Modules may exchange data, information, and signals when executed. Modules may also share data and information when executed. In the FIG. 2 embodiment, the memory 210 of end node 200 of the present invention includes a signaling/control module 212 and signaling/control data 214.

The signaling/control module 212 controls processing relating to receiving and sending signals, e.g., messages, for management of state information storage, retrieval, and processing. Signaling/control data 214 includes state information, e.g., parameters, status and/or other information relating to operation of the end node. In particular, the signaling/control data 214 includes configuration information 216, e.g., end node identification information, and operational information 218, e.g., information about current processing state, status of pending responses, etc. The module 212 accesses and/or modify the data 214, e.g., updating the configuration information 216 and/or the operational information 218.

The message generation module 251 is responsible for generating messages for various operations of the end node 200. Neighbor notification message 280 and signaling message 281 are exemplary messages generated according to this invention.

The link selection module 213 is responsible for selecting a link, e.g., the best link, from the plurality of links available to end node 200 for the transmission of the next message ready to be transmitted by end node 200. The link selection algorithm is based on various link quality parameters including at least some of but not limited to link latency, link channel conditions, link error rate, and link transmission power requirements.

The physical layer attachment point identifier (PID) determination module 270 is responsible for determining the PID corresponding to broadcast signals received from an access node. The PID determination module 270 includes a cell identification module 271, a carrier identification module 272, and a sector identification module 273. In some but not all embodiments, a combination of a cell identifier, carrier identifier and sector identifier are used as physical attachment point identifiers. Each of these identifier elements corresponds to physical layer identification information. For example, the cell identifier identifies a physical cell or cell type. The carrier identifier identifies the physical carrier, e.g, the carrier frequency or tone block while the sector identifier identifies a sector in a corresponding cell. Not all of this information need be used to implement a PID and the particular element of a PID may vary depending on the system implementation. For example, in a system which does not use sectorized cells there would be no need for a sector ID. Similarly, in a single carrier system there may be no need for a carrier ID. Making a PID determination, in one exemplary system, includes the steps of operating the cell identification module 271 for the determination of a cell identifier, operating the carrier identification module 272 for the determination of a carrier identifier and operating the sector identification module 273 for the determination of a sector identifier. Thus, it should be appreciated that different signals which pass through a single physical transmitter element, e.g., antenna, can correspond to different physical layer attachment points, e.g., where each of the different physical layer attachment points may be uniquely identified at least within a local area, by a combination of physical identifiers. For example, it should be appreciated that a combination of an antenna or sector identifier in combination with a first carrier identifier might be used to identify a first physical layer attachment point while a second carrier identifier in combination with the same antenna or sector identifier may be used to identify a second physical layer attachment point.

The physical layer attachment point identifiers (PIDs) information 260 is a list of PIDs, (PID1 261, PID2 262) which are PIDs determined using the PID determination module 260. One exemplary implementation of a physical layer attachment point identifiers (PIDs) may be a connection identifier (CID) which may be included in messages when sending and/or receiving messages. Particular exemplary CIDs are discussed further below.

Memory 210 also includes a neighbor notification module 290, a message transmission control module 292, and a link establishment module 294. The neighbor notification module 290 is used for transmitting a neighbor notification, e.g., a neighbor notification message 280, to access nodes. Message transmission control module 292 is used for controlling the transmitter module 234. Link establishment module 294 is used for establishing a wireless communications links with access nodes.

Figure 3:
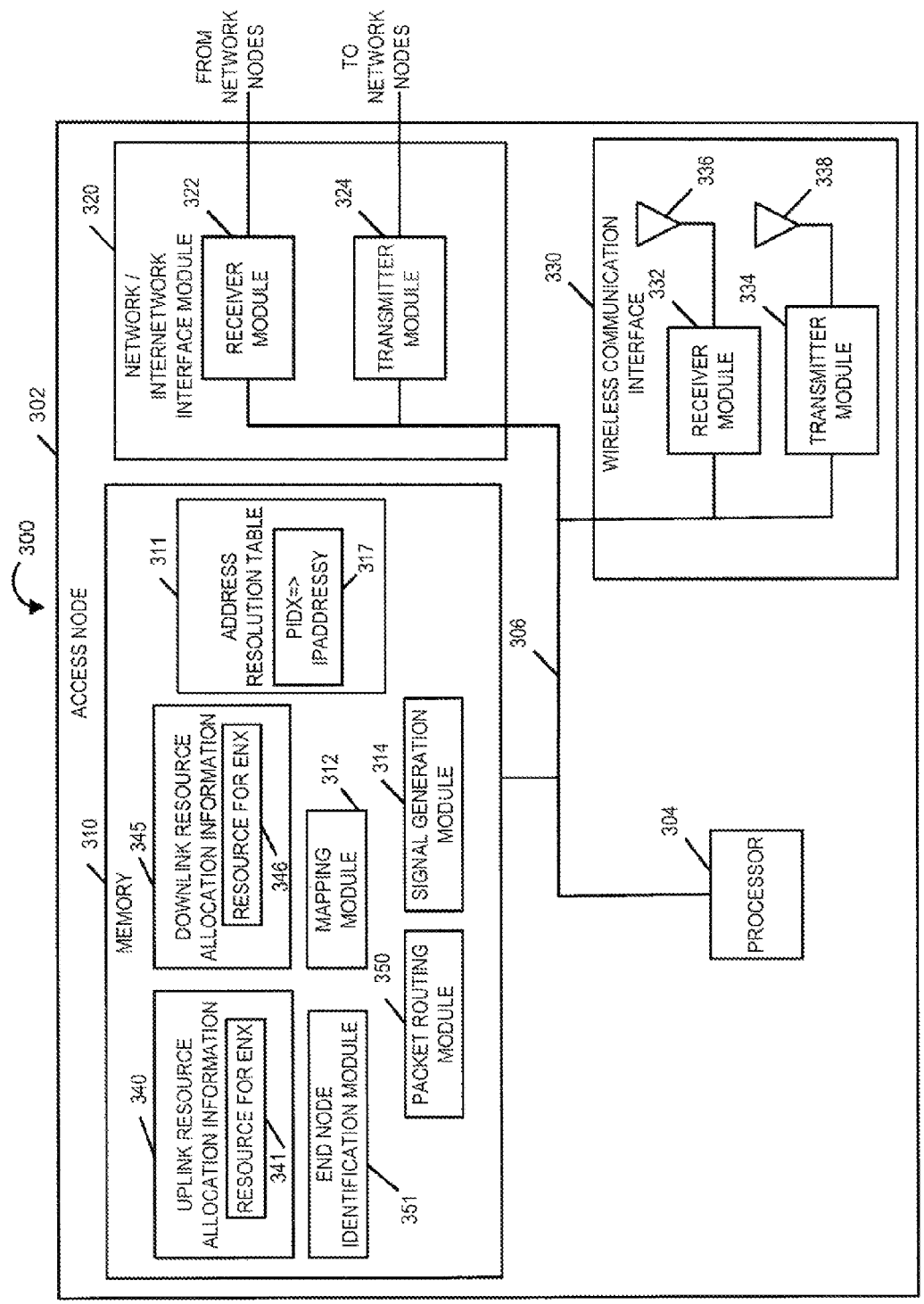
FIG. 3 illustrates an exemplary access node implemented in accordance with the present invention.

FIG. 3 provides a detailed illustration of an exemplary access node 300 implemented in accordance with the present invention. The exemplary access node 300, depicted in FIG. 3, is a detailed representation of an apparatus that may be used as any one of the access nodes 140, 140', 140" depicted in FIG. 1. In the FIG. 3 embodiment, the access node 300 includes a processor 304, memory 310, a network/internetwork interface 320 and a wireless communication interface 330, coupled together by bus 306. Accordingly, via bus 306 the various components of the access node 300 can exchange information, signals and data. The components 304, 306, 310, 320, 330 of the access node 300 are located inside a housing 302.

The network/internetwork interface 320 provides a mechanism by which the internal components of the access node 300 can send and receive signals to/from external devices and network nodes. The network/internetwork interface 320 includes, a receiver module 322 and a transmitter module 324 used for coupling the node 300 to other network nodes, e.g., via copper wires or fiber optic lines. The wireless communication interface 330 also provides a mechanism by which the internal components of the access node 300 can send and receive signals to/from external devices and network nodes, e.g., end nodes. The wireless communication interface 330 includes, e.g., a receiver module 332 with a corresponding receiving antenna 336 and a transmitter module 334 with a corresponding transmitting antenna 338. The interface 330 is used for coupling the access node 300 to other network nodes, e.g., via wireless communication channels.

The processor 304 under control of various modules, e.g., routines, included in memory 310 controls operation of the access node 300 to perform various signaling and processing. The modules included in memory 310 are executed on startup or as called by other modules that may be present in memory 310. Modules may exchange data, information, and signals when executed. Modules may also share data and information when executed.

In the FIG. 3 embodiment, the memory 310 of the access node 300 of the present invention includes a signal generation module 314 for the generation of signals, a packet routing module 350 responsible for the routing of signals and messages, a mapping module 312 that is responsible for mapping PIDs to network layer addresses, an address resolution table 311 including PID to IP address mappings 317. Memory 310 also includes an end node identification module 351 identifying end nodes with which the access node 300 is in communications with, uplink resource allocation information 340 responsible for allocating uplink resources, to end nodes, including resources allocated to an end node X 341 and, downlink resource allocation information 345 responsible for allocating downlink resources to end nodes, including resources allocated to an end node X 346.

Figure 9:
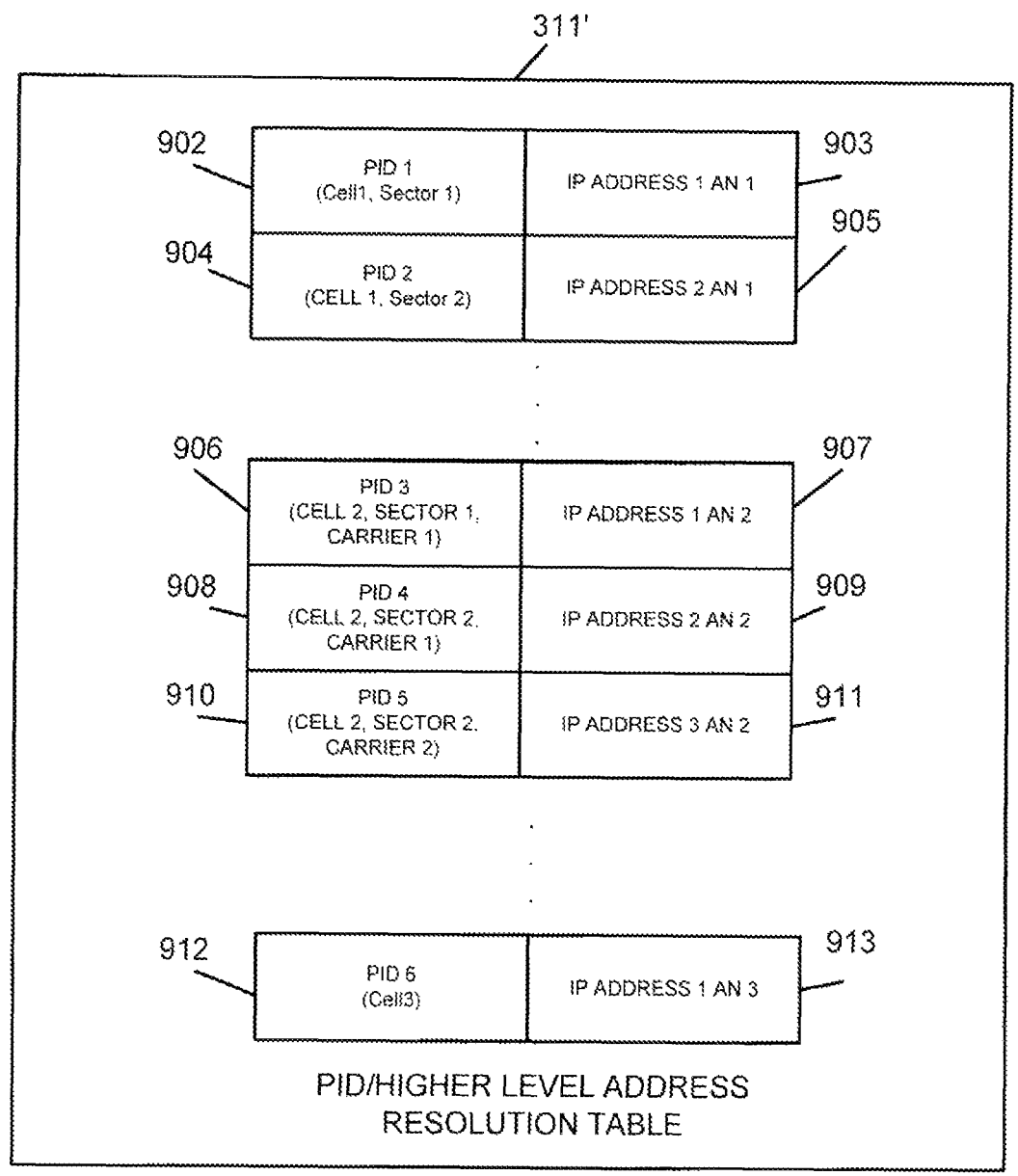
FIG. 9 illustrates an exemplary PID to higher level address resolution table which may be used for mapping between (to/from) PIDs and corresponding higher level addresses.

Referring now briefly to FIG. 9, FIG. 9 illustrates an address resolution table 311' which may be used as the address resolution table 311 shown in FIG. 3. The address resolution table 311' includes PIDs 902, 904, 906, 908, 910, 912 and information indicating the corresponding IP addresses 903, 905, 907, 909, 911 and 913, respectively. The PIDs are each unique locally, e.g., the PIDS of immediately adjacent cells are unique from one another. Note that the content of the PIDs may vary depending on the physical characteristics of the access node and number of physical layer attachment points supported by the access node to which the PID corresponds. In the FIG. 9 example, PLDs 902, 904 correspond to a first access node (AN 1) which supports two sectors which use the same carrier. Accordingly, in the case of AN 1, it is sufficient for the PID to include a cell identifier and a sector type identifier to uniquely identify the physical layer attachment points in the cell. PIDs 906, 908, 910 correspond to a cell which supports multiple carriers and multiple sectors. Accordingly, the PIDs for access node 2 are implemented as CIDs in the same manner as used in various exemplary embodiments discussed further herein. PID 912 corresponds to a third access node which includes a single sector and uses a single carrier. Accordingly, it is sufficient for PID 6 which corresponds to the third access node to include just a cell identifier although additional physical layer identification, e.g., a sector and/or carrier identifier. The inclusion of such additional information may be desirable where, from a processing perspective, consistent PID formats across multiple cells is desirable.

Figure 4:
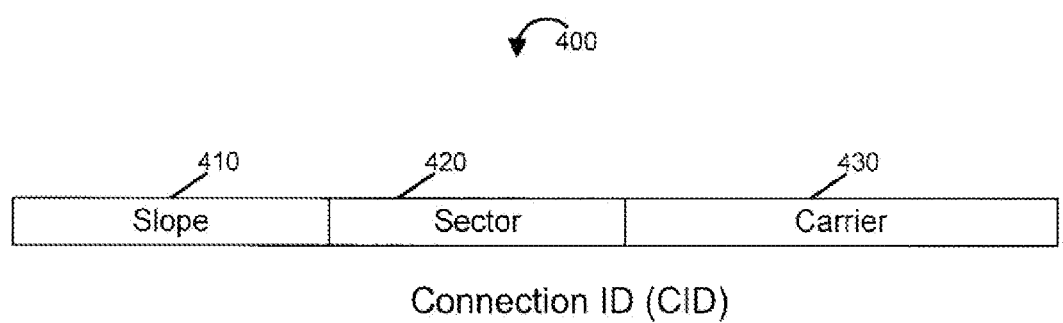
FIG. 4 illustrates an exemplary Connection Identifier implemented according to this invention.

Referring now to FIG. 4, FIG. 4 illustrates an exemplary Connection IDentifier (CID) 400 implemented according to this invention. CID 400 includes a Slope 410, which is a cell Identifier, a Sector 420 which is a Sector Identifier and a Carrier 430, which is a carrier frequency identifier also known as tone block identifier.

In an exemplary communication system using OFDM technology, in the physical layer, the spectrum is divided into a number of tones and reused in cells and sectors in neighboring geographical areas. In order to improve the interference characteristics, the tones used in each cell/sector hop over time, and different cells and sectors in neighboring geographical areas use different hopping sequences, which specify how the tones shall hop. The hopping sequences are generated using a predetermined function controlled with two input variables, namely, the cell identifier, e.g., slope value, and a sector identifier. The sector identifier may be implemented as a sector type identifier that indicates which of a plurality of possible sector types a particular sector corresponds to. In one embodiment, the slope value is an integer from 1 to 112, and the sector identifier value is an integer from 0 to 5. Neighboring cells and sectors use different pairs of slope and sector identifier so that the generated hopping sequences are different. In one embodiment, all the sectors in a cell use the same slope value but different sector identifiers, and neighboring, e.g., physically adjacent, cells use different slope values.

Furthermore, the exemplary OFDM communication system, in some embodiments, uses multiple carriers or tone blocks, so that the available tones are grouped into multiple tone blocks. Tones in a tone block are preferably contiguous. In one exemplary system, hopping of the tones in a given tone block is limited to that tone block. That is, the hopping sequences are such that the tones can hop within the tone block but cannot hop across multiple tone blocks. Tone blocks are indexed with a carrier identifier. In one embodiment, the carrier identifier is an integer 0, 1, or 2.

When an end node sets up a connection to get wireless networking services, the entity on the network side is an access node, e.g., a base station in a cell/sector, and the connection is defined with respect to a single tone block. Therefore, in the above exemplary OFDM communication system, a combination of slope, sector identifier and carrier identifier can be used as a locally unique identifier that identifies the connection for the wireless terminal. The combination is thus a connection identifier based on one or more physical layer identifiers. In one embodiment, multiple wireless terminals can have connections with the same base station cell/sector on the same tone block. Those connections normally will share the same connection identifier since they are connected to the same physical layer attachment point as defined by the combination of cell, sector and tone block. The combination of the connection identifier and a wireless terminal identifier can be used to indicate a communication connection with a particular wireless terminal.

In general, the connection identifier is a number or a combination of numbers that locally uniquely identifies a connection. In various embodiments, the number or numbers are physical layer characteristic parameters. In another embodiment, e.g., an exemplary embodiment of a CDMA communication system, the connection identifier can be the combination of a pseudo noise (PN) sequence offset and another parameter, e.g., a carrier identifier if multiple carriers are used.

Figure 5:
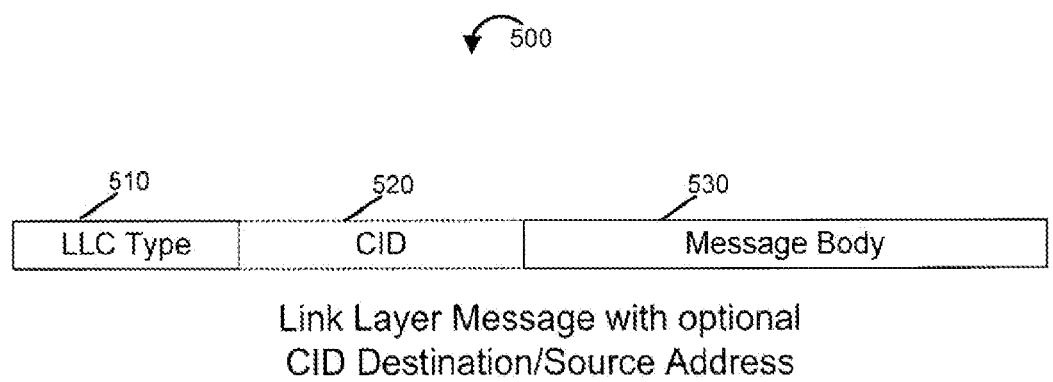
FIG. 5 illustrates an exemplary message using the Connection Identifier of FIG. 4 implemented according to this invention.

FIG. 5 illustrates an exemplary message 500, in accordance with the present invention, which uses the Connection Identifier of FIG. 4. Exemplary message 500 is a link layer message which includes a CID destination/source address. The CID destination/source address is an optional field in link layer messages in accordance with some embodiments of the present invention. Link layer message 500 includes a Link Layer Control (LLC) Type field 510 identifying the type of Message Body 530 included in the message 500. CID 520 is a Connection ID in the form of the Connection ID 400 of FIG. 4. In one embodiment of this invention the CID field 520 identifies a destination physical attachment point when sent from an end node to an access node in accordance with the invention and identifies a source physical attachment when sent from an access node to an end node in accordance with the invention.

Figure 6:
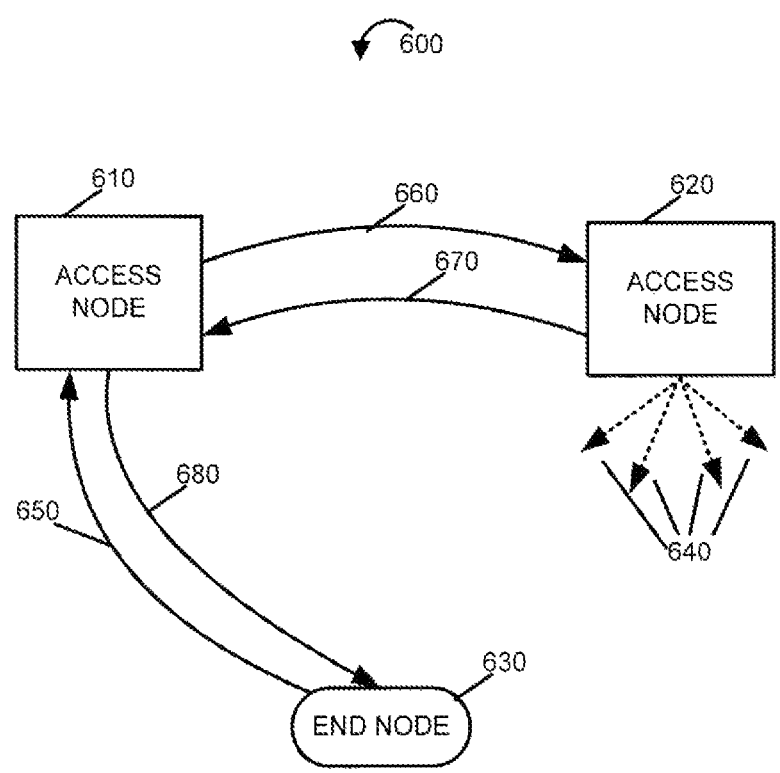
FIG. 6 illustrates exemplary signaling performed in accordance with the present invention when an end node maintains a bidirectional connection to one access node and wants to communicate with another access node.

FIG. 6 illustrates an exemplary communications method and corresponding signaling performed in accordance with various exemplary embodiments of the invention. In FIG. 6 end node 630 communicates with access node 620 via access node 610 without a wireless uplink link between end node 630 and access node 620 and without the end node having to know an IP address of the access node 620. The signaling is illustrated in the context of exemplary system 100 illustrated in FIG. 1. Access Nodes 610 and 620 are similar to access nodes 140, 140' and 140" of system 100 in FIG. 1 and they are implemented according to the access node 300 of FIG. 3. The End Node 630 is similar to end node 144, 146, 144', 146', 144" and 146" of system 100 in FIG. 1, and it is implemented according to end node 200 in FIG. 2.

In FIG. 6, end node 630 maintains a bidirectional link with access node 610, which means that it can send messages to and receive message from access node 610. End node 630 in FIG. 6, although inside the transmission range of access node 620, does not have an uplink with access node 620. This means that while end node 630 can receive and process broadcast information sent by access node 620 (e.g., broadcast messages 640), end node 630 can not send messages to access node 620 over the air and access node 620 can not receive and process messages sent to it by end node 630 over the air interface. In one embodiment of this invention this may be because end node 630 and access node 620 do not have sufficient timing synchronization. Due to certain limitations, e.g., limited hardware capability, end node 630 may not be able to establish an uplink connection with access node 620 while end node 630 currently has a bidirectional connection with access node 610. In one embodiment, the uplinks used by access node 610 and access node 620 are in different carriers, e.g., the frequency band of the uplink used by access node 610 is different from the frequency band of the uplink used by access node 620. If end node 630 can only generate uplink signal in one band at a given time, for example, because end node 630 only has one radio frequency (RF) chain due to cost considerations, then end node 630 cannot simultaneously maintain two uplink connections in two separate frequency bands. In another embodiment where the uplinks used by access nodes 610 and 620 are in the same band, the two uplinks may not be time synchronized, because the two access nodes are not time synchronized or because of the difference in the propagation delay for the signal to reach access nodes 610 and 620 from the end node 630. If end node 630 can generate just one uplink signal according to one timing synchronization scheme at a time, for example, because end node 630 has a single digital processing chain limited to one timing scheme at a time, then end node 630 cannot simultaneously maintain two uplink connections, when the connections are not sufficiently timing synchronized with one another.

End node 630 receives broadcast signal(s) 640 which are transmitted by access node 620. The signal(s) 640, according to the embodiment of this invention, are sufficient to determine the Connection ID, similar to CID 400 of FIG. 4, corresponding to the specific physical attachment of access node 620 that transmits broadcast signal 640. The signals or signals 640 may include beacon and/or pilot signals which may be transmitted over one or more symbol transmission time periods.

End node 630 transmits a message 650 to access node 610. In an exemplary embodiment of this invention, said message 650 is the same as, or similar to, exemplary message 500 of FIG. 5. The CID field, equivalent to CID 520 of FIG. 5, of said message 650 is set to the connection identifier that identifies the physical attachment point of access node 620 that broadcasted signal 640. Said message 650 is thus destined for access node 620 although it is sent to access node 610. Note that since end node 630, in the FIG. 6 example, does not have an uplink with access node 620 it can not send message 650 directly to said access node 620.

Access node 610 receives message 650 and examines the CID field, corresponding to CID 520 of FIG. 5, of message 650 and realizes, from the stored CID to link layer identification information that it does not identify one of its own physical attachment points. In such a case, access node 610 searches its memory for said CID of message 650 to find a mapping to a corresponding higher layer identifier for access node 620 (e.g., an IP address).

For example, a base station which includes multiple sectors operating under a single link layer controller and/or multiple carriers used under a single link layer controller may have multiple CIDs corresponding to a link layer identifier corresponding to a single link layer controller. In embodiments where separate link layer controllers are used for each sector and/or carrier, different link layer identifiers may be used for each for the different sector and/or carriers. In some embodiments, there is a one to one mapping between physical attachment points and link layers but this is not necessary and there may be several physical attachment points operating under a single link layer. Thus, multiple physical layer identifiers may correspond to the same link layer link identifier but each physical layer identifier connection identifier normally maps to, at most, a single link layer link identifier.

Assuming a mapping to a higher layer address is found, access node 610 encapsulates at least part of message 650 into a network layer message 660 which includes a destination address set to the identifier of access node 620 and transmits said message 660 to access node 620. According to this invention message 660 also includes an end node 630 identifier, said identifier being, depending on the embodiment, one of an end node 630 IP address, end node 630 Network Access Identifier (NAI) and a temporary identifier. Access node 620 receives said message 660 and extracts the encapsulated part of message 650 from it. Access node 620 inspects the CID field of the extracted encapsulated part of message 650 and recognizes that the CID field identifies one of its own physical attachments points.

Access node 620 sends message 670 which includes at least part of message 650 received encapsulated in message 660 by access node 620. Said message 670 also includes an end node 630 identifier similar to the one included in message 660. Access node 610 then receives message 670 and by examining the end node identifier included determines that the message 670 encapsulates a message 680 destined to end node 630. Access node 610 then sends message 680 which includes at least part of the message 670. According to this invention message 680 includes the CID of the physical attachment point of access node 620 that broadcasts signal 640.

End node 630 receives message 680 from access node 610 but by examining the CID field included in said message 680, e.g., by comparing it to stored CID information, it determines that message 680 is originated from access node 620 in response to message 650 sent to it earlier.

Figure 7:
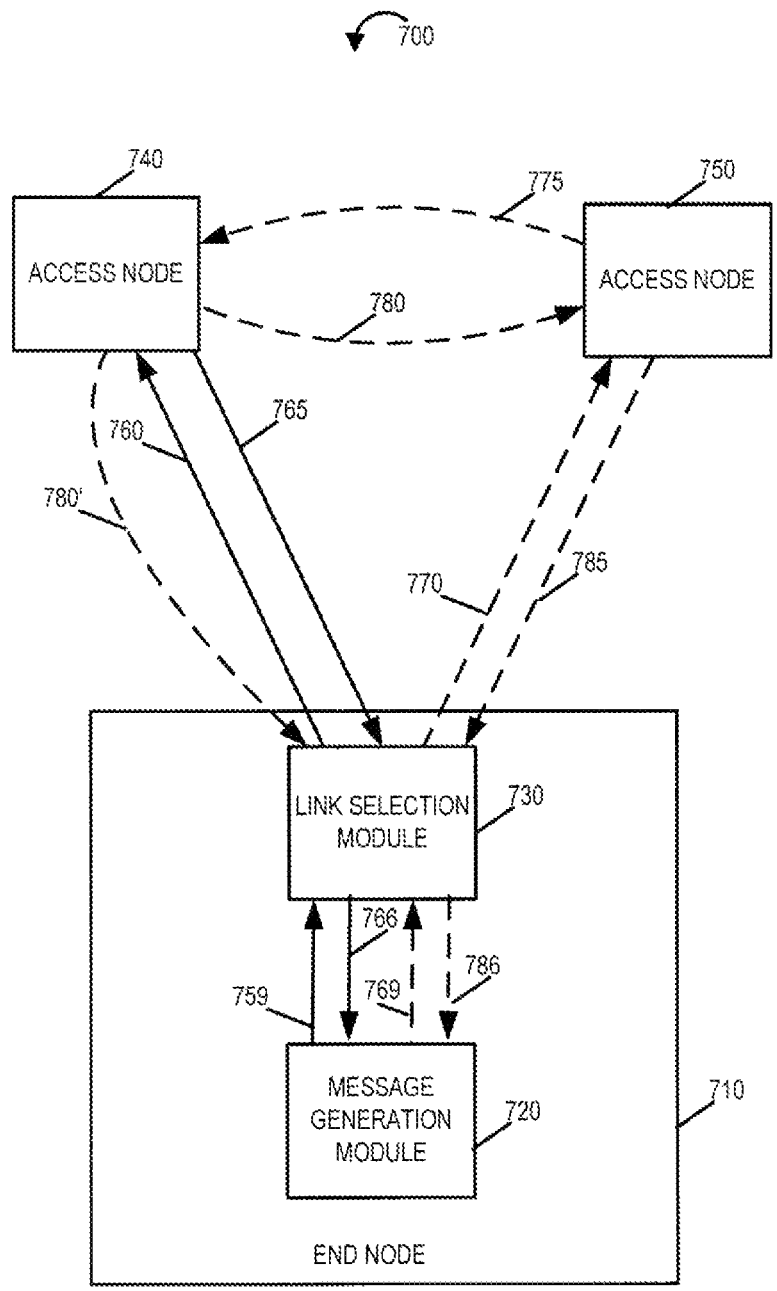
FIG. 7 illustrates exemplary signaling performed in accordance with the present invention when an end node maintains bidirectional connections with multiple access nodes.

FIG. 7 illustrates exemplary signaling performed in accordance with various embodiments of the invention. The signaling is illustrated in the context of exemplary system 100 illustrated in FIG. 1. End node 710 is a simplified depiction of end node 200 of FIG. 2 and it is the same as, or similar to, to the end nodes 144, 146, 144', 146', 144", 146" of system 100 in FIG. 1. Access Nodes 740 and 750 are similar to access nodes 140, 140' and 140" of system 100 in FIG. 1 and they are implemented using access node 300 of FIG. 3. In FIG. 7, end node 710 includes a message generation module 720 and a link selection module 730. The message generation module 720 of FIG. 7, can be used by applications running in end node 710 to generate messages for their purposes. For example a connection control protocol application maybe included and active in end node 710 allowing the end node 710 to communicate with access nodes for the purpose of creating, disconnecting and/or modifying links between end node 710 and one or both of access nodes 740, 750. Another example is a quality of service (QoS) application which may be included in end node 710. The QOS application when present can modify QoS characteristics of the various links of end node 710. Link selection module 730 of FIG. 7 measures various metrics for the quality of connections including link latency, link channel conditions, link error rate, and link transmission power requirements to determine, e.g., on a message by message basis or at a particular point in time, which of the available links is the most appropriate for the transmission of the next message.

The resulting link quality information can, and in various embodiments is, used to determine which of the plurality of simultaneous links to which a message should be transmitted at a particular point in time.

In FIG. 7, end node 710 maintains bidirectional links with access nodes 740 and 750, which means that it can send messages to and received message from access node 740 and 750. In this embodiment of the invention the message generation module 720 of end node 710 generates message 759 with ultimate destination access node 740. Message 759 is first sent in link selection module 730 of end node 710. Link selection module 730 selects the link between the links to access nodes 740 and 750 over which the next message is to be transmitted. The link determination function is based on link characteristics including at least one of link latency, link channel conditions, link error rate, and link transmission power requirements.

In the exemplary embodiment of this invention depicted in FIG. 7, the link selection module 730 selects the link to access node 740 and transmits message 760 over it. Message 760 includes at least some part of message 759 and, in some embodiment of the invention, includes additional fields used for the transmission of a message over the link between end node 710 and access node 740. For example, the additional fields are, in some embodiments, link framing fields. Since the ultimate destination of message 759 and 760 is access node 740, access node 740 receives message 760, processes the received message and responds, e.g., by transmitting message 765 to end node 710. Message 765 is received by end node 710 and delivered to the message generation module as message 766. Message generation module 720, generates a second message 769 with the ultimate destination being the access node 740. Message 769 is sent to link selection module 730 which selects the link over which message 769 is to be transmitted. In this embodiment of the invention the link to access node 750 is selected and message 770 is transmitted to access node 750. Message 770 includes at least a part of message 769 and in some embodiments of this invention includes additional fields used for the transmission of the message over the link between end node 710 and 750. For example, the additional fields are, in some embodiments link framing fields.

In one embodiment of this invention the link selection module 730 adds an identifier, e.g., a physical attachment point identifier, of access node 740 together with at least a part of message 769 in comprising message 770, because the link selected by link selection module 730 for the transmission of message 770 does not correspond to the ultimate destination of message 770, which is access node 740. In another embodiment of this invention the link selection module adds the identifier of the ultimate destination of message 760 and 770 before it transmits said messages 760 and 770, independently from which link is selected for their transmission. In a further embodiment of this invention messages 759, 769 include the identifier of their ultimate destination. For example in an example of the exemplary embodiment of FIG. 7 the identifier of the ultimate destination corresponds to access node 740.

In one exemplary embodiment of this invention, message 770 is implemented according to message 500 of FIG. 5, where CID field 520 identifies access node 740. Access node 750, receives message 770 and processes it. By examining the ultimate destination of message 770, e.g., a physical attachment point identifier in the CID field 520 of message 500 of FIG. 5, access node 750 determines that message 770 is not intended for itself but for some other node identified by the ultimate destination identifier (e.g., a CID in the CID field). The Access node 750 looks up the physical attachment point identifier (PID) included in message 770 in its address resolution table (see address resolution table 311 in access node 300 of FIG. 3) to find the network address (e.g., IP Address) corresponding to the PID included in message 770.

Access node 750 encapsulates at least a part of message 770 in an appropriate network layer header and transmits message 775 to access node 740. Message 775 includes at least: a part of message 770, and at least some of the IP address of access node 740. In addition the message 775 may ad in various embodiments does include some or all of the following: the IP address of access node 750, the PID of access node 740 included in message 770, the PID of access node 750 over which message 770 was received, end node 710 identifier and session identifiers for the encapsulation (also called tunneling) of messages between access node 750 and access node 740. Access Node 740 receives message 775 which it recognizes as a message intended for itself from the destination PID included in message 775.

In one embodiment of this invention access node 740 responds by transmitting message 780 which includes at least part of message 775. Access node 750 receives message 780, which includes end node 710 identifier and sends message 785 to end node 710. Message 785 includes at least part of message 780. End node 710 receives message 785 and forwards message 786 to message generation module 720.

In another embodiment of this invention access node 740 responds by transmitting, to endnote 710, message 780' including at least part of message 775. Message 780' is transmitted over the direct link between access node 740 and end node 710.

Figure 8:
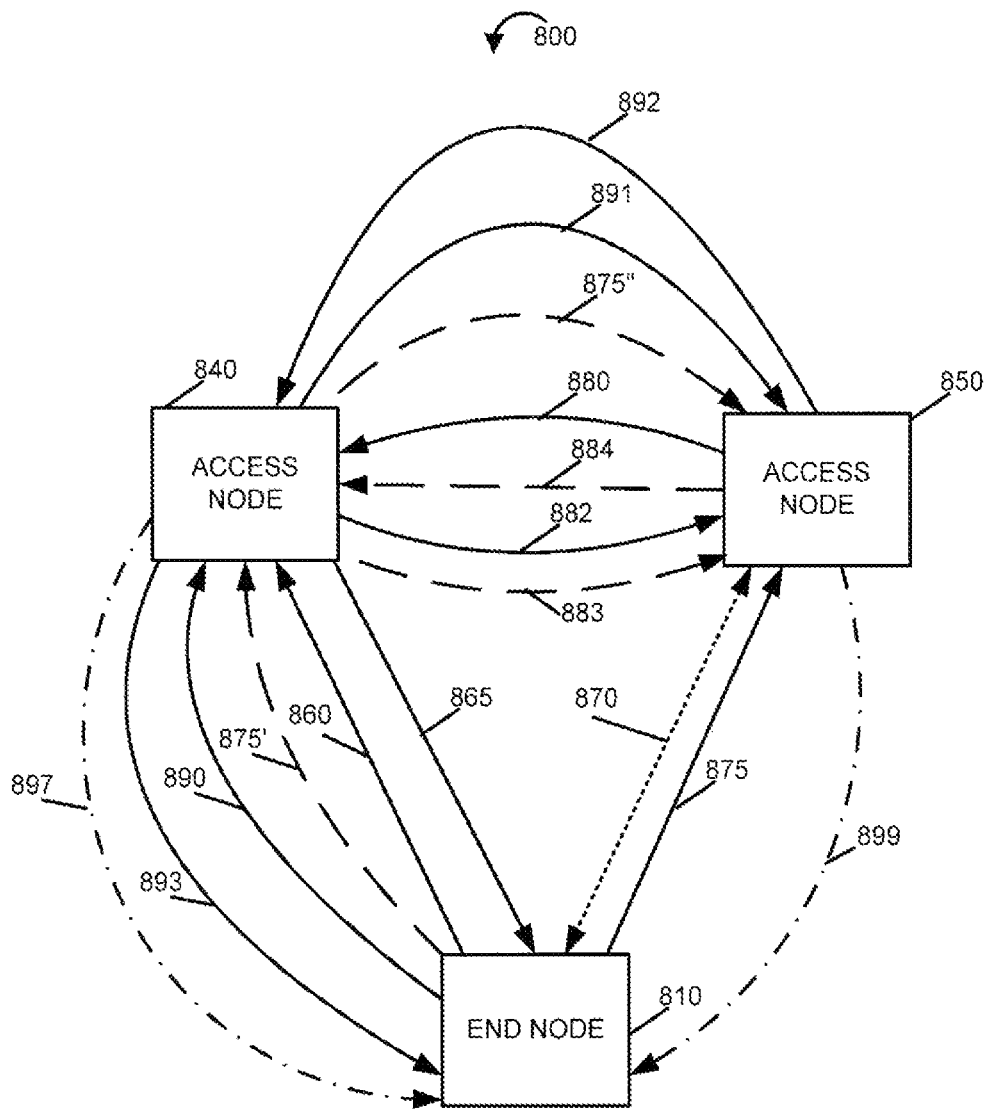
FIG. 8 illustrates exemplary signaling performed in accordance with the present invention when an end node triggers a neighbor discovery process between two access nodes.

FIG. 8 illustrates exemplary signaling performed in accordance with exemplary embodiments of the invention where an end node is used as part of a neighbor discovery and CID routing information update process. The signaling is illustrated in the context of an exemplary system such as the system 100 illustrated in FIG. 1. End node 810 is a simplified depiction of end node 200 of FIG. 2 and it is the same as or similar to the end nodes 144, 146, 144', 146', 144", 146" of system 100 in FIG. 1. Access Nodes 840 and 850 are the same as or similar to access nodes 140, 140' and 140" of system 100 in FIG. 1 and they may be implemented, e.g., using access nodes of the type illustrated in FIG. 3. In the FIG. 8 example end node 810 has a bidirectional communications link with access node 840, allowing it to send messages to, and receive message from access node 840.

In FIG. 8, end node 810 generates and transmits message 860 to access node 840. Message 860 includes an identifier that identifies access node 850 as the destination of said message. Access node 840 receives message 860 and attempts to resolve the access node 850 identifier included in said message to a network address, by searching its address resolution table, e.g., address resolution table 311 of access node 300 of FIG. 3. In the FIG. 8 example access node 840 fails to resolve said identifier. Access node 840 then transmits message 865 to end node 810. Message 865 includes an indication that routing of a message was not possible due to a resolution failure.

In one embodiment of this invention end node 810 at this point establishes a bidirectional communications link with access node 850 by exchanging a variety of messages shown as double arrowed message 870 in FIG. 8. However, this is not necessary if a bidirectional link already exists with access node 850. In another example in which the invention is used, end node 810 already has a bidirectional link with access node 850 in addition to the link with access node 840

Using the link with access node 850, the end node 810 transmits a new neighbor notification message 875 to access node 850. Message 875 includes at least an identifier of access node 840 and the network layer address of access node 840. In this way, the access node 850 is supplied with both an identifier, e.g., PID of access node 840 and a corresponding link layer address, e.g., MAC address which the access node 850 can address and store for future resolution of physical layer to network layer identifier. In one embodiment of this invention the access node 840 identifier is a physical attachment point identifier; in another embodiment of this invention it is a link layer identifier. The network layer identifier of access node 840 is known to end node 810 from communication messages 897 communicated to end node 810 during or after the establishment of the link with access node 840.

In an alternative embodiment of this invention end node 810 sends message 875' instead of message 875. Message 875' has the same or similar message content to message 875 but is sent to access node 850 via access node 840, instead of access node 850 directly. Access node 840 then routes message 875' as message 875" to access node 850. Note that unlike message 860, message 875' is a network layer message including the access node 850 network address as its destination. The network address of access node 850 is known to end node 810 from communication messages 899 communicated during or after the establishment of the link with access node 850. For this reason, access, node 840 can route message 875" to access node 850 using a network address of access node 850 e.g., IP address, without having to perform a CID to address resolution operation.

Access node 850 receives message 875 and sends new neighbor creation message 880 to the network address of access node 840, retrieved from message 875. Message 880 includes connection identifier to network layer address mappings for access node 850. In another embodiment of this invention, message 880 includes link layer identifiers to network layer address mappings for access node 850. In another embodiment of this invention message 880 includes additional neighbor information used for the accommodation of end node handoffs, including but not limited to tunnel address and tunnel session identifiers for packet redirection between access nodes 840 and 850, access node 850 capabilities with respect to quality of service, loading, protocols, and applications supported. Access node 840 receives message 880 and stores information included in message 880 in its memory e.g., for future use in CID to network address resolution operations. Access node 840 responds with message 882 acknowledging the reception of said information included in message 880.

In one embodiment of this invention access node 840 includes in message 882 some of connection identifier to network layer address mappings for access node 850, link layer identifiers to network layer address mappings for access node 850, neighbor information used for the accommodation of end node handoffs, including but not limited to tunnel address and tunnel session identifiers for packet redirection between access nodes 840 and 850, and or information indicating capabilities of access node 840 with respect to quality of service, loading, protocols, and applications supported. Access node 840 receives message 880 and stores information included in message 880 in its memory, or e.g., for future use in routing messages. In this particular embodiment of the invention messages 883 and 884 are not used.

In another embodiment of this invention access node 840 message 882 includes an acknowledgement of the reception of the information included in message 880. In this embodiment of the invention access node 840 sends message 883 including at least some of connection identifier to network layer address mappings for access node 850, link layer identifiers to network layer address mappings for access node 850, neighbor information used for the accommodation of end node handoffs, including but not limited to tunnel address and tunnel session identifiers for packet redirection between access nodes 840 and 850, access node 840 capabilities with respect to quality of service, loading, protocols, and applications supported. Access node 850 receives message 883 and stores the information included in message 883 in its memory, e.g., for future use. Access node 850 responds with message 884 acknowledging the reception of said information.

Following the exchanges of neighboring information and identifier to address mappings between access node 840 and 850 via message 880, 882 and optionally 883 and 884, end node 810 sends message 890 to access node 840. Like message 860, in one embodiment of the invention message 890 is also the same as or similar to message 500 of FIG. 5. Message 890 identifies as its ultimate destination access node 850. Access node 840, receives message 890, searches its memory for a mapping between the access node 850 identifier and a network address for said node 850 and finds said network address in its address resolution table which was earlier populated by message 880. Access node 840 encapsulates message 890 according to information in the resolution table and sends it to access node 850 in the form of message 891. Access node 850 responds with message 892 again using information in its address resolution table and message 891. Access node 840 sends message 893 to end node 810 including at least part of message 892 received from access node 850 completing the communication exchange between end node 810 and access node 850 via access node 840.

In the above described manner, through the use of messages from end node 810, access nodes 840 and 850 are provided with address and/or PID information about each other that can be used in routing subsequently received messages. Accordingly, as access nodes are added to the network, end nodes can serve to discover their presence from broadcast signals and notify access nodes of new neighbors. As part of the notification process sufficient address information is distributed to facilitate network PID based routing of messages after the notification process has been completed.

In various embodiments nodes described herein are implemented using one or more modules to perform the steps corresponding to one or more methods of the present invention, for example, signal processing, message generation and/or transmission steps. Thus, in some embodiments various features of the present invention are implemented using modules. Such modules may be implemented using software, hardware or a combination of software and hardware. Many of the above described methods or method steps can be implemented using machine executable instructions, such as software, included in a machine readable medium such as a memory device, e.g., RAM, floppy disk, etc. to control a machine, e.g., general purpose computer with or without additional hardware, to implement all or portions of the above described methods, e.g., in one or more nodes. Accordingly, among other things, the present invention is directed to a machine-readable medium including machine executable instructions for causing a machine, e.g., processor and associated hardware, to perform one or more of the steps of the above-described method(s).

Numerous additional variations on the methods and apparatus of the present invention described above will be apparent to those skilled in the art in view of the above description of the invention. Such variations are to be considered within the scope of the invention. The methods and apparatus of the present invention may be, and in various embodiments are, used with CDMA, orthogonal frequency division multiplexing (OFDM), or various other types of communications techniques which may be used to provide wireless communications links between access nodes and mobile nodes. In some embodiments the access nodes are implemented as base stations which establish communications links with mobile nodes using OFDM and/or CDMA. In various embodiments the mobile nodes are implemented as notebook computers, personal data assistants (PDAs), or other portable devices including receiver/transmitter circuits and logic and/or routines, for implementing the methods of the present invention.

What is claimed is:

1. A wireless terminal operable for wireless communications, comprising:
   means for discovering a first access node that has been added to a network, wherein the means for discovering the first access node includes a receiver configured to receive broadcast information from the first access node;
   means for determining an identifier of the first access node based on the broadcast information, and wherein the identifier includes at least two of: i) a cell identifier, ii) a carrier identifier and iii) a sector identifier;
   means for sending a first message to a second access node over a wireless communication link;
   means for receiving a second message from the second access node, wherein the second message indicates failure of routing the first message to the first access node due to address resolution failure; and
   means for transmitting a third message to the first access node or to the second access node in response to receiving the second message, wherein the third message includes the at least two of the i) the cell identifier, ii) the carrier identifier and iii) the sector identifier and enables address resolution for message routing between the first access node and the second access node resolution by enabling at least one of the first access node or the second access node to determine a network layer address for message routing between the first access node and the second access node.

2. A wireless terminal operable for wireless communications, comprising:
   circuitry configured for:
   discovering a first access node that has been added to a network, wherein the discovering the first access node includes receiving of broadcast information from the first access node;
   determining an identifier of the first access node based on the broadcast information, and wherein the identifier includes at least two of: i) a cell identifier, ii) a carrier identifier and iii) a sector identifier;
   sending a first message to a second access node over a wireless communication link;
   receiving a second message from the second access node, wherein the second message indicates failure of routing the first message to the first access node due to address resolution failure; and
   transmitting a third message to the first access node or to the second access node in response to receiving the second message, wherein the third message includes the at least two of the i) the cell identifier, ii) the carrier identifier and iii) the sector identifier and enables address resolution for message routing between the first access node and the second access node by enabling at least one of the first access node or the second access node to determine a network layer address for routing messages between the first access node and the second access node.

3. A method for wireless communications, comprising:
   discovering by an end node a first access node that has been added to a network, wherein the discovering the first access node includes receiving of broadcast information from the first access node;
   determining by the end node an identifier of the first access node based on the broadcast information, and wherein the identifier includes at least two of: i) a cell identifier, ii) a carrier identifier and iii) a sector identifier;
   sending by the end node a first message to a second access node over a wireless communication link;
   receiving at the end node a second message from the second access node, wherein the second message indicates failure of routing the first message to the first access node due to address resolution failure; and
   transmitting by the end node a third message to the first access node or to the second access node in response to receiving the second message, wherein the third message includes the at least two of the i) the cell identifier, ii) the carrier identifier and iii) the sector identifier and enables address resolution for message routing between the first access node and the second access node by enabling at least one of the first access node or the second access node to determine a network layer address for routing messages between the first access node and the second access node.

4. A non-transitory computer-readable medium having instructions thereon, the instructions comprising:
- code for causing a wireless terminal to discover a first access node that has been added to a network, wherein the discovery of the first access node includes code to receive of broadcast information from the first access node;
- code for causing the wireless terminal to determine an identifier of the first access node based on the broadcast information, and wherein the identifier includes at least two of: i) a cell identifier, ii) a carrier identifier and iii) a sector identifier;
- code for causing the wireless terminal to send a first message to a second access node over a wireless communication link;
- code for causing the wireless terminal to receive a second message from the second access node, wherein the second message indicates failure of routing the first message to the first access node due to address resolution failure; and
- code for causing the wireless terminal to transmit a third message to the first access node or to the second access node in response to receiving the second message, wherein the third message includes the at least two of the i) the cell identifier, ii) the carrier identifier and iii) the sector identifier and enables address resolution for message routing between the first access node and the second access node by enabling at least one of the first access node or the second access node to determine a network layer address for routing messages between the first access node and the second access node.

* * * * *